(12) United States Patent
King et al.

(10) Patent No.: US 11,646,388 B2
(45) Date of Patent: May 9, 2023

(54) GROUP-IV SOLAR CELL STRUCTURE USING GROUP-IV OR III-V HETEROSTRUCTURES

(75) Inventors: Richard R. King, Thousand Oaks, CA (US); Christopher M. Fetzer, Valencia, CA (US); Nasser H. Karam, La Canada, CA (US)

(73) Assignee: THE BOEING COMPANY, Arlington, VA (US)

( * ) Notice: Subject to any disclaimer, the term of this patent is extended or adjusted under 35 U.S.C. 154(b) by 29 days.

(21) Appl. No.: 13/616,933

(22) Filed: Sep. 14, 2012

(65) Prior Publication Data

US 2014/0076386 A1 Mar. 20, 2014

(51) Int. Cl.
*H01L 31/078* (2012.01)
*H01L 31/0725* (2012.01)
*H01L 31/074* (2012.01)
*H01L 31/0443* (2014.01)
(Continued)

(52) U.S. Cl.
CPC ........ *H01L 31/078* (2013.01); *H01L 31/0443* (2014.12); *H01L 31/0687* (2013.01); *H01L 31/074* (2013.01); *H01L 31/0725* (2013.01); *H01L 31/0745* (2013.01); *Y02E 10/544* (2013.01); *Y02P 70/50* (2015.11)

(58) Field of Classification Search
CPC ..... Y02E 10/50; Y02E 10/544; Y02E 10/521; H01L 31/18; H01L 31/0725; H01L 31/0527; H01L 31/0687; H01L 31/06875; H01L 31/1804; H01L 31/03762; H01L 31/0522; H01L 33/10; H01L 31/02381; H01L 31/074; H01L 31/1844; H01L 31/0745; H01L 31/078

USPC .......................... 136/255, 256, 244, 246, 249
See application file for complete search history.

(56) References Cited

U.S. PATENT DOCUMENTS

| | | |
|---|---|---|
| 4,128,733 A | 12/1978 | Fraas et al. |
| 4,191,593 A | 3/1980 | Cacheux |
| 4,253,882 A | 3/1981 | Dalal |

(Continued)

FOREIGN PATENT DOCUMENTS

| | | |
|---|---|---|
| DE | 102010010880 A1 | 9/2011 |
| EP | 1 109 230 A2 | 6/2001 |

(Continued)

OTHER PUBLICATIONS

Kouvetakis et al., "Independently Tunable Electronic and Structural Parameters in Ternary Group IV Semiconductors for Optoelectronic Applications," The 5th International Symposium on Advanced Science and Technology of Silicon Materials (JSPS Si Symposium), Nov. 10-14, 2008, Kona, HI, 4 pages.

(Continued)

*Primary Examiner* — Mayla Gonzalez Ramos
(74) *Attorney, Agent, or Firm* — MH2 Technology Law Group LLP

(57) ABSTRACT

Device structures, apparatuses, and methods are disclosed for photovoltaic cells that may be a single junction or multijunction solar cells, with at least one layer comprising a group-IV semiconductor in which part of the cell comprises a second layer comprising a III-V semiconductor or group-IV semiconductor having a different composition than the group-IV semiconductor of the first layer, such that a heterostructure is formed between the first and second layers.

27 Claims, 22 Drawing Sheets

(51) Int. Cl.
   *H01L 31/0745* (2012.01)
   *H01L 31/0687* (2012.01)

(56) References Cited

U.S. PATENT DOCUMENTS

| | | | |
|---|---|---|---|
| 4,575,577 | A | 3/1986 | Fraas |
| 4,631,352 | A | 12/1986 | Daud et al. |
| 4,867,801 | A | 9/1989 | Stanbery |
| 5,206,534 | A | 4/1993 | Birkle et al. |
| 5,405,453 | A | 4/1995 | Ho et al. |
| 5,496,415 | A * | 3/1996 | Barnham ............... 136/255 |
| 5,716,442 | A | 2/1998 | Fertig |
| 5,779,817 | A | 7/1998 | Wecker |
| 5,800,630 | A | 9/1998 | Vilela et al. |
| 6,316,715 | B1 | 11/2001 | King et al. |
| 6,340,788 | B1 | 1/2002 | King et al. |
| 7,122,734 | B2 | 10/2006 | Fetzer et al. |
| 9,099,595 | B2 | 8/2015 | King et al. |
| 9,947,823 | B2 | 4/2018 | King et al. |
| 9,985,160 | B2 | 5/2018 | King et al. |
| 9,997,659 | B2 | 6/2018 | King et al. |
| 2002/0164834 | A1 * | 11/2002 | Boutros et al. ............ 438/59 |
| 2002/0179142 | A1 | 12/2002 | Wada et al. |
| 2002/0195137 | A1 | 12/2002 | King et al. |
| 2003/0038610 | A1 | 2/2003 | Munshi et al. |
| 2003/0070707 | A1 | 4/2003 | King et al. |
| 2003/0140962 | A1 | 7/2003 | Sharps et al. |
| 2003/0145884 | A1 | 8/2003 | King et al. |
| 2004/0065363 | A1 | 4/2004 | Fetzer et al. |
| 2004/0200523 | A1 * | 10/2004 | King et al. ............... 136/262 |
| 2005/0081910 | A1 | 4/2005 | Danielson et al. |
| 2005/0167709 | A1 | 8/2005 | Augusto |
| 2007/0137695 | A1 | 6/2007 | Fetzer et al. |
| 2009/0078311 | A1 | 3/2009 | Stan et al. |
| 2009/0173373 | A1 | 7/2009 | Walukiewicz et al. |
| 2009/0188544 | A1 | 7/2009 | Kobayashi et al. |
| 2009/0280597 | A1 | 11/2009 | Wijekoon et al. |
| 2010/0096001 | A1 | 4/2010 | Sivananthan et al. |
| 2010/0229930 | A1 * | 9/2010 | Fetzer ............... 136/255 |
| 2010/0243038 | A1 | 9/2010 | Kukulka |
| 2010/0276731 | A1 | 11/2010 | Nam et al. |
| 2010/0282305 | A1 * | 11/2010 | Sharps ............ H01L 31/0687 |
| | | | 136/255 |
| 2010/0282306 | A1 | 11/2010 | Sharps et al. |
| 2010/0282307 | A1 | 11/2010 | Sharps et al. |
| 2011/0005570 | A1 | 1/2011 | Jain |
| 2011/0120538 | A1 | 5/2011 | Lochtefeld et al. |
| 2011/0132445 | A1 * | 6/2011 | Pitera et al. ............... 136/255 |
| 2011/0180129 | A1 * | 7/2011 | Roberts ............... 136/255 |
| 2011/0254052 | A1 | 10/2011 | Kouvetakis et al. |
| 2011/0316043 | A1 | 12/2011 | Kouvetakis et al. |
| 2012/0017976 | A1 | 1/2012 | Nechache et al. |
| 2012/0167967 | A1 | 7/2012 | Gori et al. |
| 2012/0240987 | A1 * | 9/2012 | King ............... B82Y 20/00 |
| | | | 438/57 |
| 2013/0025654 | A1 * | 1/2013 | Bedell et al. ............... 136/255 |
| 2013/0048063 | A1 * | 2/2013 | Walters et al. ............... 136/255 |
| 2013/0056053 | A1 | 3/2013 | Lochtefeld et al. |
| 2013/0206219 | A1 * | 8/2013 | Kurtin ............ H01L 31/03925 |
| | | | 136/255 |
| 2013/0263923 | A1 * | 10/2013 | Jones-Albertus ... H01L 31/0725 |
| | | | 136/262 |
| 2014/0076386 | A1 | 3/2014 | King et al. |
| 2014/0076389 | A1 | 3/2014 | King et al. |
| 2014/0076401 | A1 | 3/2014 | King et al. |
| 2015/0333208 | A1 | 11/2015 | King et al. |
| 2018/0190850 | A1 | 7/2018 | King et al. |
| 2018/0190851 | A1 | 7/2018 | King et al. |
| 2018/0248067 | A1 | 8/2018 | King et al. |
| 2018/0277702 | A1 | 9/2018 | King et al. |

FOREIGN PATENT DOCUMENTS

| | | |
|---|---|---|
| JP | 2002-0368238 A | 12/2002 |
| JP | 2004-111687 A | 4/2004 |
| JP | 2004111687 A | 4/2004 |
| KR | 20110128155 A | 11/2011 |
| WO | WO 2013/033671 A1 | 3/2013 |
| WO | WO 2013030531 A1 | 3/2013 |
| WO | WO 2013033671 A1 | 3/2013 |

OTHER PUBLICATIONS

Shahrjerdi et al., "Low-Temperature a-Si:H/GaAs Heterojunction Solar Cells," IEEE Journal of Photovoltaics, vol. 1, No. 1, Jul. 2011, pp. 104-107.

Sun et al., "Efficient Si-on-Ge Tandem Solar Cell," 2009 6th IEEE International Conference on Group IV Photonics, pp. 187-189.

Conley et al., "High Efficiency MH Solar Cells and TPV Using SiGeSn Materials," 2011, IEEE, pp. 1189-1192.

Cornfield et al., "Evolution of a 2.05 eV AlGaInP Top Sub-Cell for 5 and 6J-IMM Applications," 2011, IEEE, pp. 2788-2791.

Extended European Search Report dated Sep. 9, 2017 for EP Application No. 13184428.4.

Extended European Search Report dated Sep. 15, 2017 for EP Application No. 1318442.9.

Extended European Search Report dated Sep. 13, 2017 for EP Application No. 13184422.7.

Extended European Search Report dated Sep. 19, 2017 for EP Application No. 13184436.7.

Extended European Search Report dated Sep. 12, 2017 for EP Application No. 13184418.5.

Extended European Search Report dated Sep. 21, 2017 for EP Application No. 13184437.5.

Bulent Erol Sagol, European Office Action issued in corresponding European Application No. 13 184 421.9 dated Apr. 17, 2020, pp. 1-7.

Bulent Erol Sagol, European Office Action issued in corresponding European Application No. 13 184 418.5 dated Apr. 16, 2020, pp. 1-6.

Bulent Erol Sagol, European Office Action issued in corresponding European Application No. 13 184 422.7 dated Apr. 17, 2020, pp. 1-7.

Daniel J. Aiken, "InGaP/GaAs/Ge Multi-Junction Solar Cell Efficiency Improvements Using Epitaxial Germanium," Sandia National Laboratories, pp. 994-997.

P. R. Sharps et al., "Development Of 20% Efficient GaInAsP Solar Cells," Research Triangle Institute, 6 pages.

P. R Sharps, "Growth And Development of GaInAsP for Use in High-Efficiency Solar Cells," National Renewable Energy Laboratory, 1994, NREL/TP-451-7166 UC Category: 1264 DE95000210, 32 pages.

E. Welser, W.Guter, A.Wekkeli, F.Dimroth, "Memory effect of GeinIII-V semiconductors", Journal of Crystal Growth 310, Aug. 23, 2008, pp. 4799-4802.

Communication pursuant to Article 94(3) EPC issued in related European Application No. 13184437.5, 8 pages.

Communication pursuant to Article 94(3) EPC issued in related European Application No. 13184436.7, 8 pages.

Aiken, "InGaP/GaAs/Ge Multi-Junction Solar Cell Efficiency Improvements Using Epitaxial Germanium," Proceedings of 28th IEEE Photovoltaic Specialists Conference, Sep. 15-22, 2000, pp. 994-997.

Anderson et al., "Experiments on Ge—GaAs Heterojunctions," Solid State Electronics, vol. 5, No. 5, Sep. 1962, pp. 341-344.

Sahai, et al., "Heterojunction solar cell Calculations," Solid State Electronics, vol. 13, No. 9, Sep. 1970, pp. 1289-1299.

Communication pursuant to Article 94(3) EPC issued in related European Application No. 13184428.4, 7 pages.

Communication pursuant to Article 94(3) EPC issued in related European Application No. 13184421.9, 6 pages.

Communication pursuant to Article 94(3) EPC dated Jun. 30, 2021 in related European Application No. 13184418.5, 8 pages.

* cited by examiner

GROUP-IV SOLAR CELL STRUCTURE USING GROUP-IV OR III-V HETEROSTRUCTURES

TECHNOLOGICAL FIELD

The present disclosure relates to photovoltaic cells and their methods of manufacture and, more particularly, to improved single-junction cells or subcells in a multijunction photovoltaic (PV) cell, especially a solar cell, having multiple layers to form a heterostructure.

BACKGROUND

Advances in photovoltaic cells remain important for terrestrial and non-terrestrial applications. In the non-terrestrial environment of outer space, as well as terrestrial applications, photovoltaic cells offer a valuable means for providing power generation by converting the abundant resource of the sun's energy to electrical power.

Irrespective of the application, and as with any energy generation system, efforts continue to increase the output and/or efficiency of PV cells. With respect to output, multiple cells or layers having differing energy bandgaps have been stacked so that each cell or layer can absorb a different part of the wide energy distribution of photons found in sunlight. Stacked arrangements have been provided in monolithic structures on a single substrate, or on multiple substrates.

In the multiple cell device, known as multijunction solar cells, multijunction photovoltaic cells, or multijunction cells, semiconductor materials are typically lattice-matched to form the solar cells within the multiple cell device, known as subcells within the multijunction solar cell. Each subcell typically contains at least one collecting p-n (or n-p) junction. A multijunction solar cell with 2 subcells is typically called a 2-junction cell; one with 3 subcells is called a 3-junction cell, etc. so that cells with n subcells are called n-junction cells, where n is an integer.

Additionally, the subcells within a multijunction cell are often interconnected in series by tunnel junctions between subcells, that act as low resistance contacts that typically are not photoactive. In contrast, the collecting junctions in each subcell typically are photoactive. The term photoactive means that a given photoactive layer, structure, subcell, etc. within a solar cell contributes to the output current and/or voltage of the overall solar cell, in response to light incident on the solar cell. As described earlier in the text, the numbering of 2-junction (2J), 3-junction (3J), and, in general, n-junction (nJ) solar cells is determined by the number of subcells, or collecting junctions, not including tunnel junctions.

The collecting junction of a photovoltaic solar cell or subcell typically consists of a p-n junction between a layer of one doping type (either p-type or n-type), typically called an emitter layer, and another layer of the opposite doping type, typically called a base layer. The junction may also consist of a p-i-n junction in which an intrinsic semiconductor layer with little or no extrinsic dopant concentration is placed between the emitter layer of one doping type and the base layer of the opposite doping type. Typically, the emitter layer is considered to be the layer that is closer to the primary light source for the solar cell than the base, and the base layer is considered to be the layer that is farther from the primary light source than the emitter. Typically, the front surface of a solar cell or solar cell component is considered to be the surface closer to the primary light source for the solar cell, and the back surface of a solar cell or solar cell component is considered to be the surface farther from the light source. However, there can be exceptions to this typical terminology, for instance when both back surface and front surface illumination are incident on the solar cell.

Both the collecting junctions and the tunnel junctions can be of the homojunction or heterojunction type. When solar energy is absorbed by a subcell, minority carriers (i.e. electrons and holes) are generated in the conduction and valence bands of the semiconductor materials adjacent the collecting junction. A voltage is thereby created across the junction and a large portion of the photogenerated current can be collected at a finite voltage to generate electrical power. As the photons in the solar spectrum pass to the next junction that typically has been optimized for a lower energy range, additional photons in this lower energy range can be converted into a useful current. With a greater number of junctions, greater conversion efficiency and increased output voltage and electrical power can be obtained.

With multijunction cells, efficiency is limited by the requirement of low resistance interfaces between the individual cells to enable the generated current to flow from one cell to the next. In a monolithic structure, tunnel junctions have been used as described earlier in the text to minimize the blockage of current flow. In a multiple wafer structure, front and back metalization grids with low coverage fraction and transparent conductors have been used for low resistance connectivity.

Another limitation to the multiple cell PV device, or multijunction cell, is that current output in each subcell must be the same for optimum efficiency in the series-connected configuration. In addition, there has been a practical limit on the number of subcells (also referred to as collecting junctions or subcell junctions) employed, since the benefit of each successive subcell becomes smaller as the number of subcells increases, and each subcell has certain parasitic losses associated with it in practice, tending to counteract the greater efficiency that comes from dividing the incident spectrum into smaller energy ranges with a greater number of subcells.

The concern over efficiency in PV cells has created interest in optimizing 1-junction solar cells such as silicon (Si) cells and gallium arsenide (GaAs) cells, and in developing higher-efficiency multijunction cells such as conventional 3-junction GaInP/GaInAs/Ge solar cells, which employ a gallium indium phosphide (GaInP) top subcell, also called cell 1 or C1, a gallium indium arsenide (GaInAs) subcell in the cell 2 (C2) position, and a germanium (Ge) subcell formed by a Ge wafer growth substrate in the cell 3 (C3) position. In this 3-junction solar cell, cell 3 is also the bottom subcell. Thus the subcells are numbered in the order in which the incident light passes through the multijunction cell. The material name associated with a solar cell or subcell is typically the material that is the dominant photoabsorber in the cell, which is typically the base of the solar cell.

The structures described above have relatively high current densities, which can present problems for current matching subcells that are poor current producers. The comparatively high current densities and low voltages of these cells with 1 to 3 subcells result in greater relative power loss due to series resistance. Further, subcell base thicknesses can be comparatively large, and some subcells have little excess photogenerated current density, both of which impair radiation resistance. Limited excess photogenerated current density in low bandgap subcells can also impair the fill factor of the overall multijunction solar cell that they are in.

BRIEF SUMMARY

The present disclosure is directed to a photovoltaic cell comprising a first layer comprising a group-IV material and a second layer comprising a material selected from the group consisting of: a III-V semiconductor material (referred to herein as a III-V material) and a group-IV semiconductor material (referred to herein as a group-IV material) different from the first layer group-IV material, wherein a heterostructure is formed between the first layer and the second layer.

The group-IV material is preferably selected from the group consisting of Ge, Si, SiGe, CGe, GeSn, SiGeSn, CSiGeSn, and combinations thereof. According to certain variants, the second layer acts as a photovoltaic solar cell feature selected from the group consisting of an emitter, a base, a window or front-heterostructure layer, a back surface field (BSF) layer or back-heterostructure layer, an intrinsic layer, a tunnel junction layer, and a contact layer, and the first layer is a photovoltaic solar cell feature in which photogeneration of charge carriers takes place, such as, for example: a solar cell emitter, solar cell base, a solar cell absorber, a single-junction photovoltaic cell, or a subcell or solar cell feature in a multijunction photovoltaic cell, and combinations thereof, etc.

According to the disclosure, the photovoltaic cell may be a single-junction photovoltaic cell, or the photovoltaic cell is a multijunction photovoltaic cell, or a subcell within a multijunction photovoltaic cell, and the multijunction photovoltaic cell may be selected from the group consisting of a 2-junction cell, 3-junction cell, 4-junction cell, 5-junction cell, 6-junction cell, 7-junction cell, and multijunction cells with 8 or more collecting junctions or subcells (i.e. from the group comprising n-junction cells where n is an integer greater than or equal to 2) and the multijunction cell may further comprise a group-IV material to provide a selected bandgap combination among the subcells of the multijunction cell.

According to the disclosure, the photovoltaic cell may be a subcell within a multijunction photovoltaic cell that includes at least one group-IV semiconductor layer, that is epitaxially grown in a deposition apparatus, where the multijunction cell includes one or more additional subcells comprising III-V semiconductor layers.

According to the disclosure, the photovoltaic cell may be a subcell within a multijunction photovoltaic cell that includes at least one group-IV semiconductor layer, where the multijunction cell includes one or more additional subcells comprising group-IV semiconductor layers.

According to the disclosure, a heterostructure, heterointerface, or heterojunction is formed between the first layer and second layers. The first layer preferably comprises a solar cell feature selected from a group including: an emitter, a base, a window or front heterostructure layer, an intrinsic layer, a tunnel junction layer, and a contact layer. The second layer comprises a solar cell feature selected from aforementioned features found in the first layer, but that is different from the feature selected in the first layer solar cell. The second layer may further comprise a cross-column heterostructure, meaning that one side of the heterostructure comprises one family of semiconductors formed from elements from a given column or set of columns of the periodic table of elements, while the other side of the heterostructure comprises a different family of semiconductors formed from elements from a different column or set of columns of the periodic table, where the family of semiconductors for each side may be selected from a group including: group-IV semiconductors; III-V semiconductors; II-VI semiconductors; I-III-VI semiconductors; II-IV-VI semiconductors; and other families, where the roman numerals refer to the number of a column of elements in the periodic table of elements.

According to the disclosure, the electronic doping of the first layer of the photovoltaic cell comprising one or more group-IV semiconductor layers may be influenced by or may partially or entirely consist of the column-III and/or column-V elements in the second layer comprising one or more III-V semiconductor layers, where the column-III and/or column-V elements act as dopants in the one or more group-IV layers in the first layer.

According to the disclosure, the electronic doping of the second layer of the photovoltaic cell comprising one or more III-V semiconductor layers may be influenced by or may partially or entirely consist of the column-IV elements in the first layer comprising one or more group-IV semiconductor layers, where the column-IV elements act as dopants in the one or more III-V layers in the second layer.

According to the disclosure, the photovoltaic cell may have an emitter layer and a base layer, where the emitter layer is designed to be positioned closer to the primary light source for the solar cell during solar cell operation than the base layer.

According to the disclosure, the photovoltaic cell may have an emitter layer and a base layer, where the base layer is designed to be positioned closer to the primary light source for the solar cell during solar cell operation than the emitter layer.

According to the disclosure, the photovoltaic cell may have an emitter layer and a base layer, where the emitter layer is designed to be positioned at approximately the same distance from the primary light source for the solar cell during solar cell operation as the base layer.

According to the disclosure, the photovoltaic cell may have an emitter layer and a base layer, where the emitter layer is deposited, grown, diffused, or otherwise formed after the base layer of the solar cell.

According to the disclosure, the photovoltaic cell may have an emitter layer and a base layer, where the base layer is deposited, grown, diffused, or otherwise formed after the emitter layer of the solar cell.

According to the disclosure, the photovoltaic cell may have an emitter layer and a base layer, where the emitter layer is deposited, grown, diffused, or otherwise formed at approximately the same time as the base layer of the solar cell.

According to the disclosure, the photovoltaic cell may have an emitter layer and a base layer, where the emitter layer has a lower energy bandgap than the base layer of the solar cell.

According to the disclosure, the photovoltaic cell may have an emitter layer and a base layer, where the emitter layer has a higher energy bandgap than the base layer of the solar cell.

According to the disclosure, the photovoltaic cell may have an emitter layer and a base layer, where the emitter layer has approximately the same energy bandgap as the base layer of the solar cell.

According to the disclosure, energy wells comprising one or more group-IV semiconductor regions, with one of more compositions chosen to have a lower energy bandgap than adjacent regions, may be positioned in the main photogeneration layer or other group-IV photogeneration layer of a group-IV solar cell, such as the group-IV emitter or base of the solar cell, to lower the effective bandgap of the group-IV photogeneration layer, increasing the photogenerated and/or collected current density of the solar cell.

According to the disclosure, energy wells or low-bandgap absorber regions (LBARs) may be used in other subcells of the multijunction cell in which the group-IV solar cell is positioned, in order to modify the effective bandgap, light transmission, and photogenerated and collected current density in the other subcells, to achieve a trade-off between light transmitted by the other subcells to the group-IV subcell or subcells, light transmitted by the group-IV subcell of subcells to the other subcells, and the voltage, photogenerated current density, and collected current density of the group-IV subcell or subcells and the other subcells in the multijunction cell, to result in higher performance of the overall multijunction cell.

According to the disclosure, the group-IV solar cell may be combined with a reflector on the front or the back of the cell, chosen from a group including: a semiconductor Bragg reflector, a dielectric stack reflector, a metal reflector, a combined dielectric/semiconductor reflector, a combined dielectric/metal reflector, and a combined semiconductor/metal reflector, in order to increase photogenerated and collected current density, e.g., by increasing absorption and carrier photogeneration by indirect energy transitions in the energy band structure of the group-IV solar cell.

According to the disclosure, the group-IV solar cell may be combined with a passivation layer on the front or the back of the cell, to reduce surface minority-carrier recombination in the cell, chosen from a group including: a deposited amorphous silicon layer; a deposited amorphous germanium layer; a deposited amorphous layer containing carbon, silicon, and/or germanium; a dielectric layer such as silicon dioxide, silicon oxide, or silicon nitride; a deposited semiconductor layer such as zinc oxide or indium tin oxide; a chemical surface treatment such as hydrogen, fluorine, sulfur, or selenium deposited on the surface; and combinations of the above, in order increase photogenerated and collected current density, e.g., by increasing the current that can be collected from thick group-IV solar cell layers from carrier photogeneration by indirect energy transitions in the energy band structure of the group-IV solar cell.

Preferably, the heterostructure or heterojunction comprises materials on both sides of the junction, and growth, deposition, formation, and/or annealing conditions at the interface that are selected to reduce minority-carrier recombination at layer interfaces and within the materials on both sides forming the heterostructure or heterojunction.

According to the disclosure, the photovoltaic cell structure may comprise a tunnel junction connecting the first layer comprising a solar cell emitter layer formed from a group-IV layer to additional subcells in the a multijunction cell structure.

According to the disclosure, the photovoltaic cell structure may comprise a tunnel junction connecting a group-IV solar cell, comprising a first layer that comprises a solar cell emitter layer formed from a group-IV semiconductor layer, to additional subcells in the a multijunction cell structure. Here, a group-IV solar cell is a solar cell that comprises at least one group-IV layer or region formed from a group-IV semiconductor, where the at least one group-IV layer or region typically contributes to the photogenerated and collected current density and/or the voltage of the solar cell, and where the group-IV solar cell may also include other layers or regions formed from other semiconductor families, e.g. III-V semiconductors, II-VI semiconductors, etc.

According to the disclosure, the photovoltaic cell structure may further comprise a tunnel junction between an upper group-IV subcell and a lower group-IV subcell, where the upper group-IV subcell may comprise Ge, Si, SiGe, CGe, GeSn, SiGeSn, and/or CSiGeSn, and where the lower group-IV subcell may be formed on or in a growth substrate, such as a germanium (Ge) or silicon (Si) semiconductor wafer substrate.

According to the disclosure, the photovoltaic cell may further comprise: a first layer comprising a group-IV material, and a second layer comprising tunnel junctions formed from one or more III-V semiconductor layers, where the one or more tunnel junction semiconductor layers may be selected from a group including: GaAs; AlGaAs; GaInP; GaInAs; AlInP; AlInAs; AlGaInAs; GaInPAs; AlGaInP; AlGaInPAs; InP; GaP; InAs; InPAs; AlInAs; AlAs; GaSb; GaAsSb; InSb; GaInAsSb; GaInNAs; GaInNAsSb; GaN; AlN; InN; AlGaN; GaInN; AlInN; AlGaInN, and combinations thereof.

According to the disclosure, the photovoltaic cell comprises a first layer comprising an upper group-IV subcell that is an epitaxially-grown subcell comprising one or more group-IV semiconductor materials, including Ge, Si, SiGe, CGe, GeSn, SiGeSn, and CSiGeSn, and a second layer comprising tunnel junctions formed from one or more group III-V semiconductor layers, where the second layer comprising tunnel junctions may or may not be positioned adjacent to the first layer.

Moreover, the first layer comprising an upper group-IV subcell may or may not be grown on top of or positioned on top the second layer comprising III-V tunnel junctions.

Furthermore, the second layer may comprise tunnel junctions that may be selected from a group including:
  p+GaAs/n+GaAs tunnel junctions;
  p+AlGaAs/n+GaAs tunnel junctions;
  p+GaAs/n+AlGaAs tunnel junctions;
  p+AlGaAs/n+Al GaAs tunnel junctions;
  p+AlGaAs/n+GaInP tunnel junctions;
  p+AlGaAs/n+AlGaInP tunnel junctions; and
  p+AlGaInP/n+AlGaInP tunnel junctions, According to the disclosure, the photovoltaic cell may further comprise: a first layer comprising a group-IV material, and a second layer comprising one or more tunnel junction layers formed from one or more group-IV semiconductor layers, where one or more tunnel junction semiconductor layers may be selected from a group including: Ge, Si, SiGe, CGe, GeSn, SiGeSn, and CSiGeSn.

According to the disclosure, the photovoltaic cell may further comprise: a first layer comprising a group-IV material, and a second layer comprising tunnel junctions formed from on or more group-IV semiconductor layers, which may be selected from a group including:
  strained or unstrained p+Ge/n+Ge tunnel junctions;
  strained or unstrained p+SiGe/n+SiGe tunnel junctions;
  strained or unstrained p+CGe/n+CGe tunnel junctions;
  strained or unstrained p+SiGeSn/n+SiGeSn tunnel junctions;
  strained or unstrained p+CSiGeSn/n+CSiGeSn tunnel junctions;
  strained p+SiGe/n+Ge tunnel junctions;
  p+Ge/strained n+SiGe tunnel junctions;
  strained p+CGe/n+Ge tunnel junctions;
  p+Ge/strained n+CGe tunnel junctions;
  p+SiGeSn/n+Ge tunnel junctions;
  p+Ge/n+SiGeSn tunnel junctions;

p+CSiGeSn/n+Ge tunnel junctions; and p+Ge/n+CSiGeSn tunnel junctions.

According to the disclosure, the first layer comprising a group-IV material in a photovoltaic cell structure is a solar cell emitter layer, in which the majority of photogenerated current density in the solar cell is produced.

According to the disclosure, the first layer comprising a group-IV material in a photovoltaic cell structure is a solar cell emitter layer, where the majority of photogenerated current density in the solar cell is produced in a solar cell layer other than the group-IV emitter layer, such as a group-IV solar cell base layer.

According to the disclosure, the first layer comprising a group-IV semiconductor material in a photovoltaic cell structure is a solar cell emitter layer, and the second layer comprising a III-V semiconductor material and forming a cross-column heterostructure with the first layer is a solar cell base, back-surface-field (BSF), or back-heterostructure layer, having the opposite doping type with respect to the first layer.

According to the disclosure, the first layer comprising a group-IV semiconductor material in a photovoltaic cell structure is a solar cell base, BSF, or back-heterostructure layer, and the second layer comprising a III-V semiconductor material and forming a cross-column heterostructure with the first layer is a tunnel junction layer in a multijunction cell, having the same doping type with respect to the first layer.

According to the disclosure, the first layer comprising a group-IV semiconductor material in a photovoltaic cell structure is a tunnel junction layer, and the second layer comprising a III-V semiconductor material and forming a cross-column heterostructure with the first layer is a second tunnel junction layer, having the opposite doping type with respect to the first layer.

According to the disclosure, the first layer comprising a group-IV semiconductor material in a photovoltaic cell structure is a tunnel junction layer, and the second layer comprising a III-V semiconductor material and forming a cross-column heterostructure with the first layer is a buffer layer, having the same doping type with respect to the first layer.

According to the disclosure, the first layer comprising a group-IV semiconductor material in a photovoltaic cell structure comprising a group-IV homojunction p-n junction is a solar cell base layer, and the second layer comprising a III-V semiconductor material and forming a cross-column heterostructure with the first layer is a BSF or back-heterostructure layer, having the same doping type with respect to the first layer.

According to the disclosure, the first layer comprising a group-IV semiconductor material in a photovoltaic cell structure comprising a group-IV homojunction p-n junction is a solar cell first BSF or back-heterostructure layer (BSF1), and the second layer comprising a III-V semiconductor material and forming a cross-column heterostructure with the first layer is a second BSF or back-heterostructure layer (BSF2), having the same doping type with respect to the first layer.

According to the disclosure, the first layer comprising a group-IV semiconductor material in a photovoltaic cell structure comprising a group-IV homojunction p-n junction is a solar cell BSF or back-heterostructure layer, and the second layer comprising a III-V semiconductor material and forming a cross-column heterostructure with the first layer is a tunnel junction layer, having the same doping type with respect to the first layer.

According to the disclosure, the first layer comprising a group-IV semiconductor material in a photovoltaic cell structure comprising a group-IV homojunction p-n junction is a first tunnel junction layer, and the second layer comprising a III-V semiconductor material and forming a cross-column heterostructure with the first layer is a second tunnel junction layer, having the opposite doping type with respect to the first layer.

According to the disclosure, the first layer comprising a group-IV semiconductor material in a photovoltaic cell structure comprising a group-IV homojunction p-n junction is a tunnel junction layer, and the second layer comprising a III-V semiconductor material and forming a cross-column heterostructure with the first layer is a buffer layer, having the same doping type with respect to the first layer.

According to the disclosure, the first layer comprising a group-IV semiconductor material in a photovoltaic cell structure is a solar cell emitter layer, and the second layer comprising a group-IV semiconductor material and forming a group-IV heterostructure with the first layer is a base, back-surface-field (BSF), or back-heterostructure layer, having the opposite doping type with respect to the first layer.

According to the disclosure, the first layer comprising a group-IV semiconductor material in a photovoltaic cell structure is a solar cell base layer, and the second layer comprising a group-IV semiconductor material and forming a group-IV heterostructure with the first layer is a back-surface-field (BSF), or back-heterostructure layer, having the same doping type with respect to the first layer.

According to the disclosure, the first layer comprising a group-IV semiconductor material in a photovoltaic cell structure is a solar cell base, back-surface-field (BSF), or back-heterostructure layer, and the second layer comprising a group-IV semiconductor material and forming a group-IV heterostructure with the first layer is a tunnel junction layer, having the same doping type with respect to the first layer.

According to the disclosure, the first layer comprising a group-IV semiconductor material in a photovoltaic cell structure is a first tunnel junction layer, and the second layer comprising a group-IV semiconductor material and forming a group-IV heterostructure with the first layer is a second tunnel junction layer, having the opposite doping type with respect to the first layer.

According to the disclosure, the first layer comprising a group-IV semiconductor material in a photovoltaic cell structure is a solar cell emitter layer, and the second layer comprising a III-V semiconductor material and forming a cross-column heterostructure with the first layer is a base, BSF, or back-heterostructure layer, having the opposite doping type with respect to the first layer, and where the second layer forms a second cross-column heterostructure with a third layer comprising a group-IV tunnel junction layer, having the same doping type with respect to the second layer.

According to the disclosure, the first layer comprising a group-IV semiconductor material in a photovoltaic cell structure is a solar cell base layer, and the second layer comprising a III-V semiconductor material and forming a cross-column heterostructure with the first layer is a base, BSF, or back-heterostructure layer, having the same doping type with respect to the first layer, and where the second layer forms a second cross-column heterostructure with a third layer comprising a group-IV tunnel junction layer, having the same doping type with respect to the second layer.

According to the disclosure, the first layer comprising a group-IV semiconductor material in a photovoltaic cell structure is a solar cell base, BSF, or back-heterostructure layer, and the second layer comprising a III-V semiconductor material and forming a cross-column heterostructure with the first layer is a first tunnel junction layer, having the same doping type with respect to the first layer, and where the second layer forms a second cross-column heterostructure with a third layer comprising a group-IV second tunnel junction layer, having the opposite doping type with respect to the second layer.

According to the disclosure, the first layer comprising a group-IV semiconductor material in a photovoltaic cell structure is a first tunnel junction layer, and the second layer comprising a III-V semiconductor material and forming a cross-column heterostructure with the first layer is a second tunnel junction layer, having the opposite doping type with respect to the first layer, and where the second layer forms a second cross-column heterostructure with a third layer comprising a group-IV emitter, window, buffer, or nucleation layer, having the same doping type with respect to the second layer.

According to the disclosure, group-IV semiconductors such as Ge, Si, SiGe, SiGeSn, and CSiGeSn may be used as the contact or cap layers of the solar cell, where the cap or contact layers may be grown before or after a primary photogeneration layer of a solar cell of subcell in a multijunction solar cell.

According to the disclosure, group-IV semiconductors such as Ge, Si, SiGe, SiGeSn, and CSiGeSn may be used to construct bypass diodes or blocking diodes, in order to protect the multijunction solar cell or other solar cells in a circuit of electrically interconnected solar cells, where the group-IV bypass diodes or blocking diodes may be grown monolithically with the multijunction cell, and where the group-IV bypass diodes or blocking diodes may comprise multiple diodes electrically interconnected in series or parallel with one another, and/or with the solar cells upon which they are grown monolithically, and/or with the solar cells they are designed to protect electrically.

Still further, the present disclosure is directed to a photovoltaic electricity generation system, energy storage system, and/or a vehicular energy system comprising a photovoltaic cell having a first layer comprising a group-IV material and a second layer comprising a material selected from the group consisting of: a III-V semiconductor material and a group-IV semiconductor material different from the first layer group-IV material, wherein a heterostructure is formed between the first layer and the second layer.

In some alternatives, the photovoltaic cells of the present disclosure have particular usefulness as a sustainable power source for use in stationary or mobile applications including terrestrial and non-terrestrial applications, and in manned and unmanned vehicles, including aircraft, spacecraft and surface and sub-surface water-borne vehicles, etc.

Still further, the present disclosure is directed to a terrestrial, non-concentrating or concentrator photovoltaic electricity generation system, for utility-scale, commercial, residential, or personal electricity production.

Still further, the present disclosure is directed to a extra-terrestrial, non-concentrating or concentrator photovoltaic electricity generation system, for satellite, manned space vehicle, or unmanned space vehicle electric power production in space or near space applications.

According to the disclosure, the group-IV solar cell or cells may be grown upright, with the sunward surface of the cell grown last.

According to the disclosure, the group-IV solar cell or cells may be grown upright within a multijunction solar cell, with the group-IV solar cell or cells grown in a sequence with the other subcells in the multijunction cell, with the higher bandgap subcells in the multijunction solar cell grown last.

According to the disclosure, the group-IV solar cell or cells may be grown inverted, with the sunward surface of the cell grown first.

According to the disclosure, the group-IV solar cell or cells may be grown inverted within a multijunction solar cell, with the group-IV solar cell or cells grown in a sequence with the other subcells in the multijunction cell, with the higher bandgap subcells in the multijunction solar cell grown first.

According to the disclosure, the group-IV solar cell or cells may be grown lattice-matched with respect to a subcell, growth substrate, and/or semiconductor layer upon which the group-IV solar cell semiconductor is grown or deposited epitaxially.

According to the disclosure, the one or more group-IV solar cell or cells may be grown as a lattice-mismatched solar cell or cells, having a different material lattice constant with respect to a subcell, growth substrate, and/or semiconductor layer upon which the group-IV solar cell semiconductor is grown or deposited epitaxially.

According to the disclosure, the one or more group-IV solar cell or cells may be grown as a lattice-mismatched, metamorphic solar cell or cells, such that: the strain state of the group-IV solar cell is relaxed or has a low level of mechanical strain in the crystal lattice; the group-IV solar cell has a different lattice constant with respect to a subcell, growth substrate, and/or semiconductor layer in the semiconductor structure upon which the group-IV solar cell is grown; a metamorphic buffer transitions between the different lattice constants and has a relaxed crystal lattice structure due to dislocations that form in the metamorphic buffer.

According to the disclosure, the one or more group-IV solar cell or cells may be grown as a lattice-mismatched, pseudomorphic solar cell or cells, such that the strain state of the group-IV solar cell is not relaxed or has a high level of mechanical strain in the crystal lattice.

According to the disclosure, the group-IV solar cell is incorporated with other subcells in a multijunction solar cell by a method chosen from a group including: direct semiconductor-to-semiconductor bonding, or semiconductor bonding technology (SBT); dielectric bonding, metal bonding, combined dielectric and metal bonding, and adhesive bonding.

According to the disclosure, the group-IV solar cell is formed by epitaxial growth, by a method chosen from a group including: chemical vapor deposition (CVD); ultra-high-vacuum chemical vapor deposition (UHVCVD); metal-organic vapor-phase epitaxy (MOVPE); molecular beam epitaxy (MBE); and liquid phase epitaxy (LPE).

According to the disclosure, the group-IV solar cell is formed by a method chosen from a group including: dopant diffusion into a group-IV semiconductor layer; dopant diffusion into a group-IV substrate; physical vapor deposition (PVD) with or without subsequent annealing and/or recrystallization; plasma-enhanced chemical-vapor deposition (PECVD), low-pressure chemical-vapor deposition (LPCVD), chemical bath deposition (CBD), ion implantation of dopants and/or main components of the group-IV semiconductor into a starting group-IV layer or substrate.

BRIEF DESCRIPTION OF THE DRAWING(S)

Having thus described variations of the disclosure in general terms, reference will now be made to the accompanying drawings, which are not necessarily drawn to scale, and wherein:

FIG. 1 is a cross-sectional diagram of a group-IV solar cell where the primary photoabsorber is a group-IV semiconductor material such as Ge, SiGe, CGe, GeSn, SiGeSn, or CSiGeSn forming a solar cell emitter, shown as n-type in the figure, that may be doped by group-V elements from the III-V semiconductor layers beneath it and group-V elements from III-V semiconductor layers above it. The group-IV emitter forms the p-n junction of the solar cell at a cross-column heterostructure between the group-IV emitter and a III-V semiconductor base, back-surface-field (BSF), or back-heterostructure layer such as GaAs, AlGaAs, GaInAs, GaInP, AlGaInAs, or AlGaInP, that has the opposite doping type, shown as p-type in the figure, with respect to the group-IV emitter;

Figure 4:
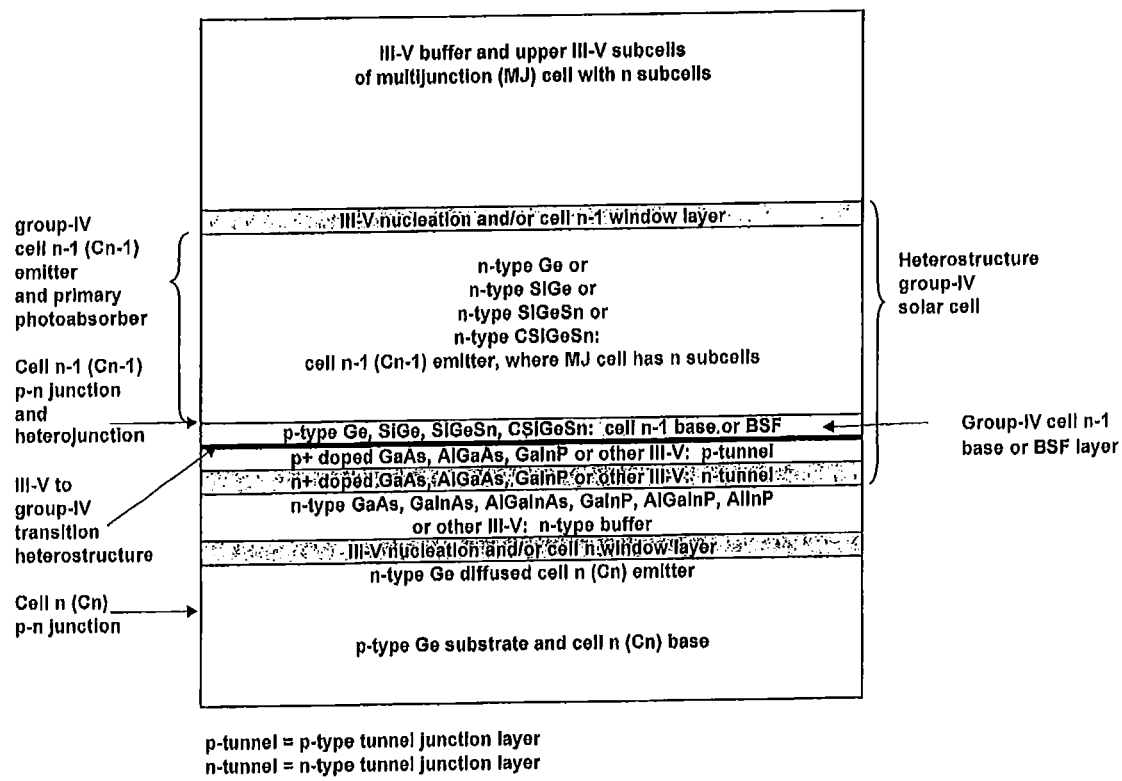

FIG. 4 is a cross-sectional diagram of a group-IV solar cell where the primary photoabsorber is a group-IV semiconductor material forming a solar cell emitter shown as n-type in the figure, and with a group-IV base, BSF, or back-heterostructure layer shown as p-type in the figure, and a III-V tunnel junction layer formed from a III-V semiconductor material and shown as p-type in the figure, forming a cross-column heterostructure between the group-IV base, BSF, or back-heterostructure and the III-V tunnel junction layer.

Figure 5:
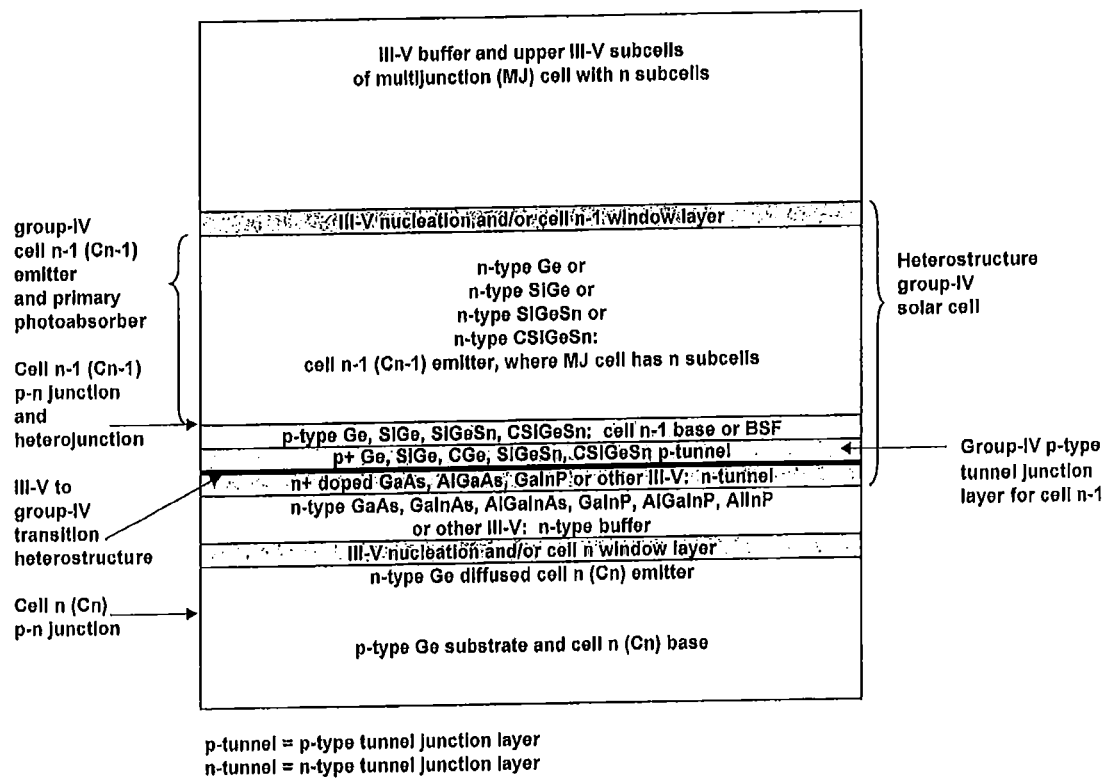

FIG. 5 is a cross-sectional diagram of a group-IV solar cell where the primary photoabsorber is a group-IV semiconductor material forming a solar cell emitter shown as n-type in the figure, and with a group-IV first tunnel junction layer shown as p-type in the figure, and a III-V second tunnel junction layer shown as n-type in the figure, forming a cross-column heterostructure between the group-IV semiconductor, first, p-type tunnel junction layer (p-tunnel) and the III-V semiconductor, second, n-type tunnel junction layer (n-tunnel).

Figure 6:
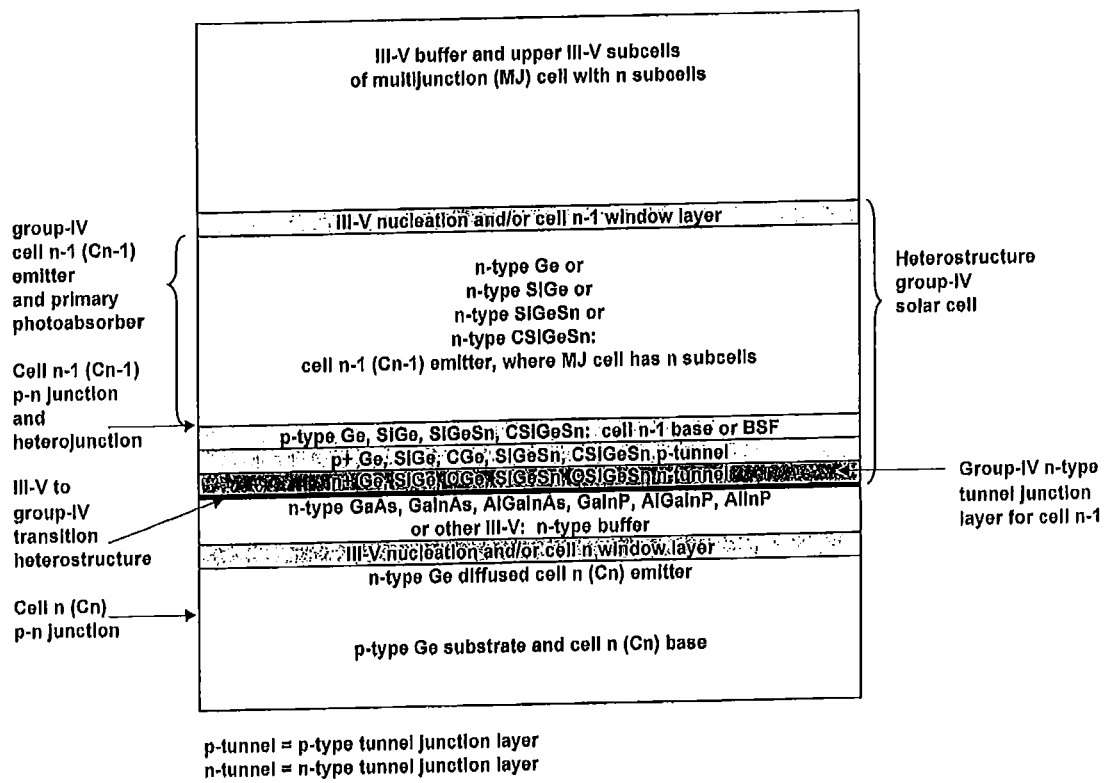

FIG. 6 is a cross-sectional diagram of a group-IV solar cell where the primary photoabsorber is a group-IV semiconductor material forming a solar cell emitter shown as n-type in the figure, and with a group-IV tunnel junction layer shown as n-type in the figure, and a III-V buffer layer shown as n-type in the figure, forming a cross-column heterostructure between the group-IV tunnel junction layer and the III-V semiconductor buffer layer.

Figure 7:
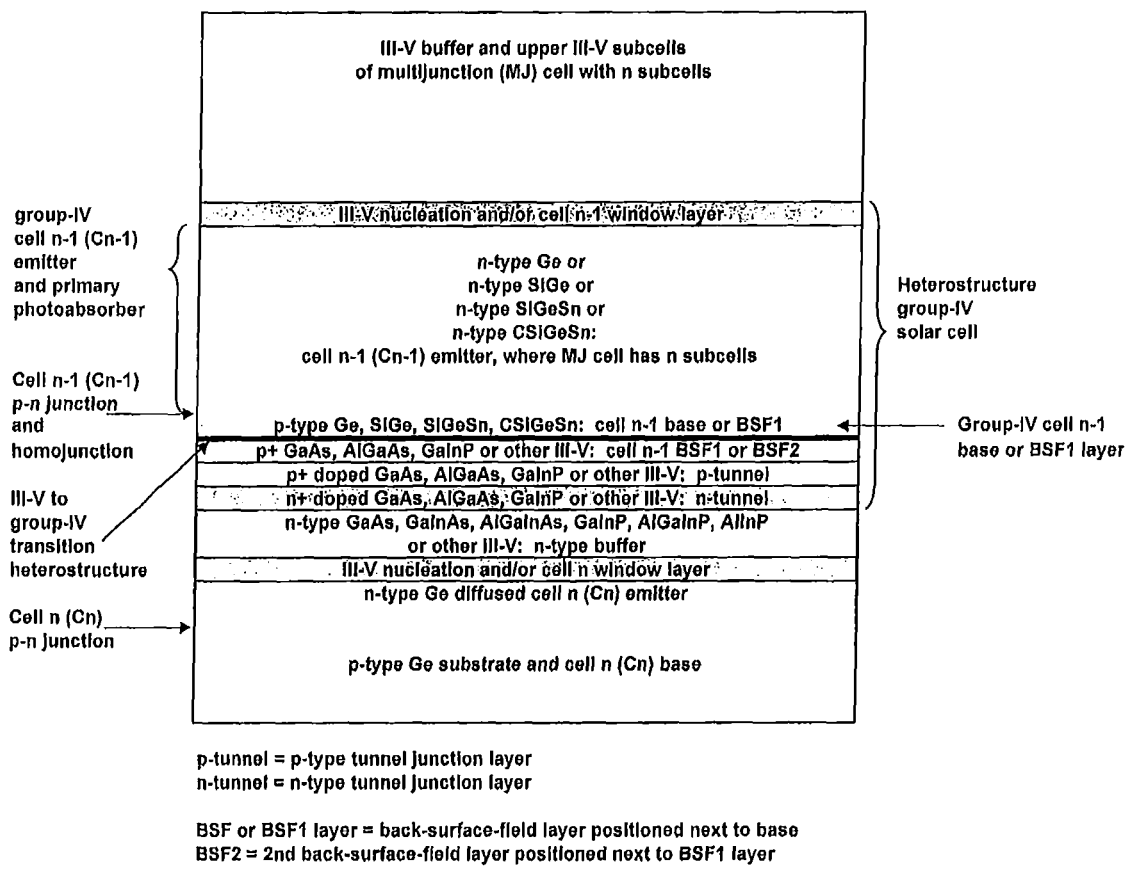

FIG. 7 is a cross-sectional diagram of a group-IV solar cell where the primary photoabsorber is a group-IV semiconductor material forming a solar cell emitter shown as n-type in the figure, and with a group-IV base layer shown as p-type in the figure and forming a homojunction p-n junction with the group-IV emitter layer, with a III-V semiconductor back-surface-field (BSF) or back-heterostructure layer shown as p-type in the figure and that forms a cross-column heterostructure between the group-IV base and the III-V BSF or back-heterostructure layer. The solar cell in the figure may also be considered to have a group-IV first BSF layer (BSF1) shown as p-type in the figure, with a III-V semiconductor second BSF (BSF2) or back-heterostructure layer shown as p-type in the figure that forms a cross-column heterostructure between the group-IV first BSF layer and the III-V second BSF or back-heterostructure layer.

Figure 8:
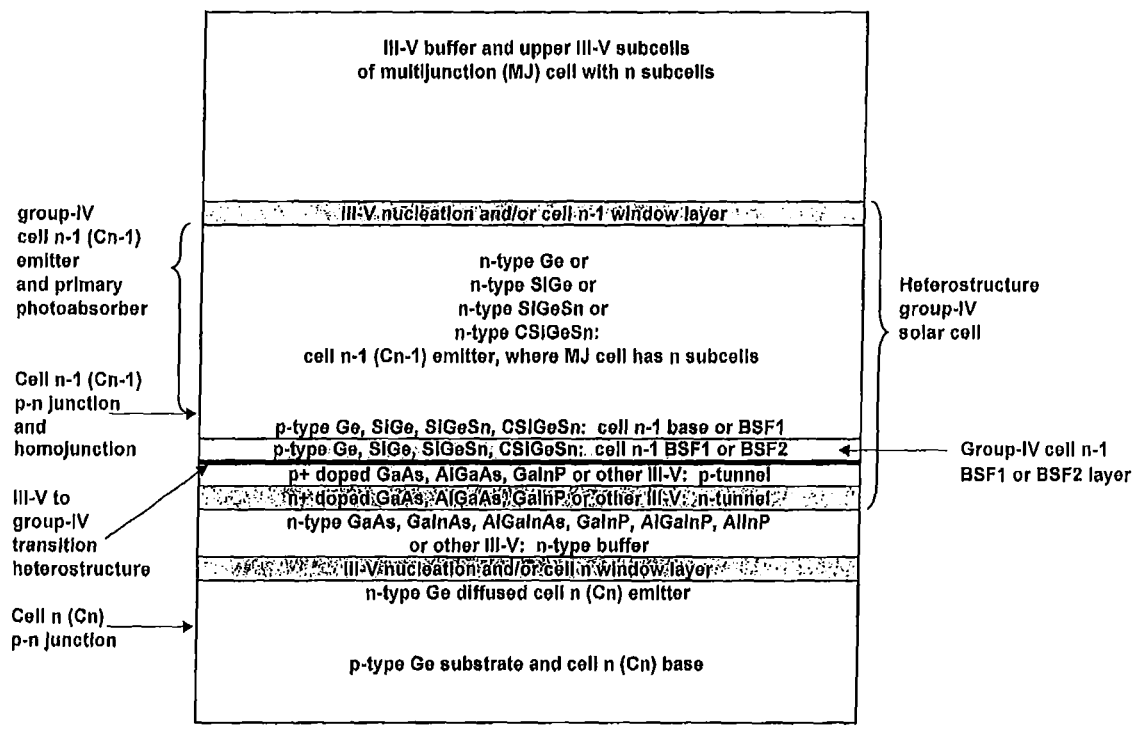

FIG. 8 is a cross-sectional diagram of a group-IV solar cell where the primary photoabsorber is a group-IV semiconductor material forming a solar cell emitter shown as n-type in the figure, and with a group-IV base layer shown as p-type in the figure and forming a homojunction p-n junction with the group-IV emitter layer, with a group-IV BSF or back-heterostructure layer shown as p-type in the figure, and with a III-V tunnel junction layer shown as p-type in the figure and that forms a cross-column heterostructure between the group-IV BSF or back-heterostructure and the III-V tunnel junction layer.

Figure 9:
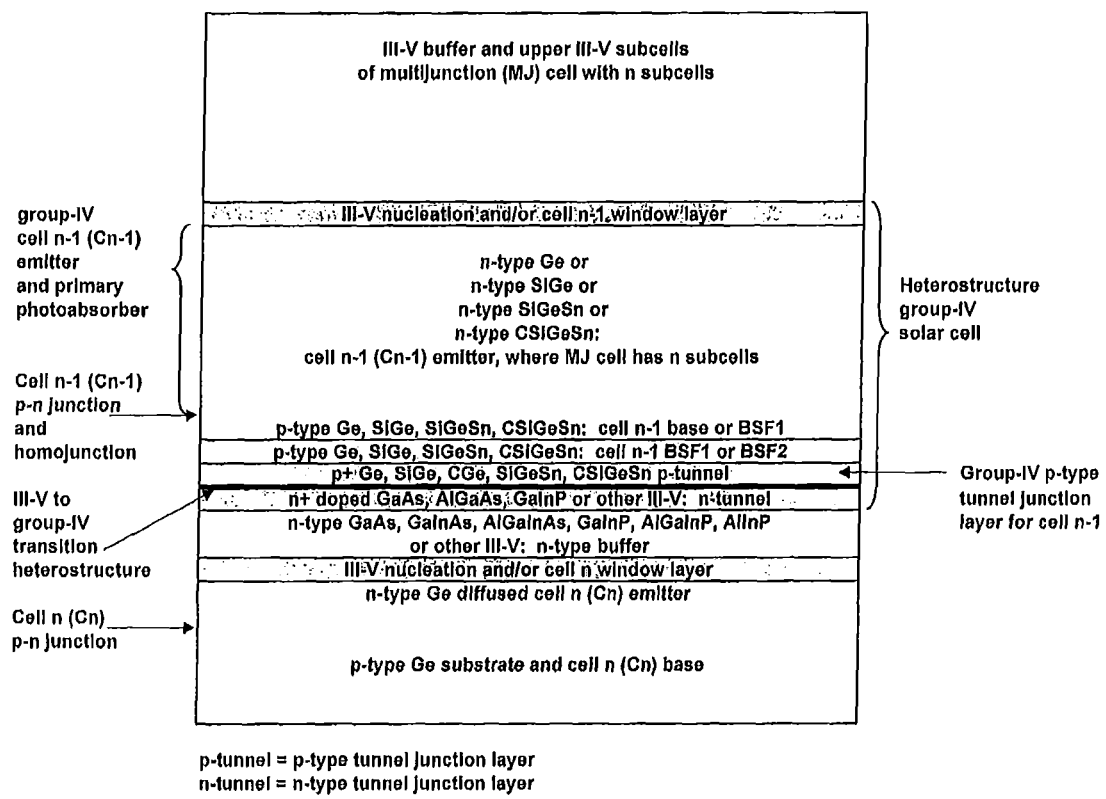

FIG. 9 is a cross-sectional diagram of a group-IV solar cell where the primary photoabsorber is a group-IV semiconductor material forming a solar cell emitter shown as n-type in the figure, and with a group-IV base layer shown as p-type in the figure and forming a homojunction p-n junction with the group-IV emitter layer, with a group-IV first tunnel junction layer shown as p-type in the figure, and with a III-V second tunnel junction layer shown as n-type in the figure and that forms a cross-column heterostructure between the group-IV semiconductor, first, p-type tunnel junction layer (p-tunnel) and the III-V semiconductor, second, n-type tunnel junction layer (n-tunnel).

Figure 10:
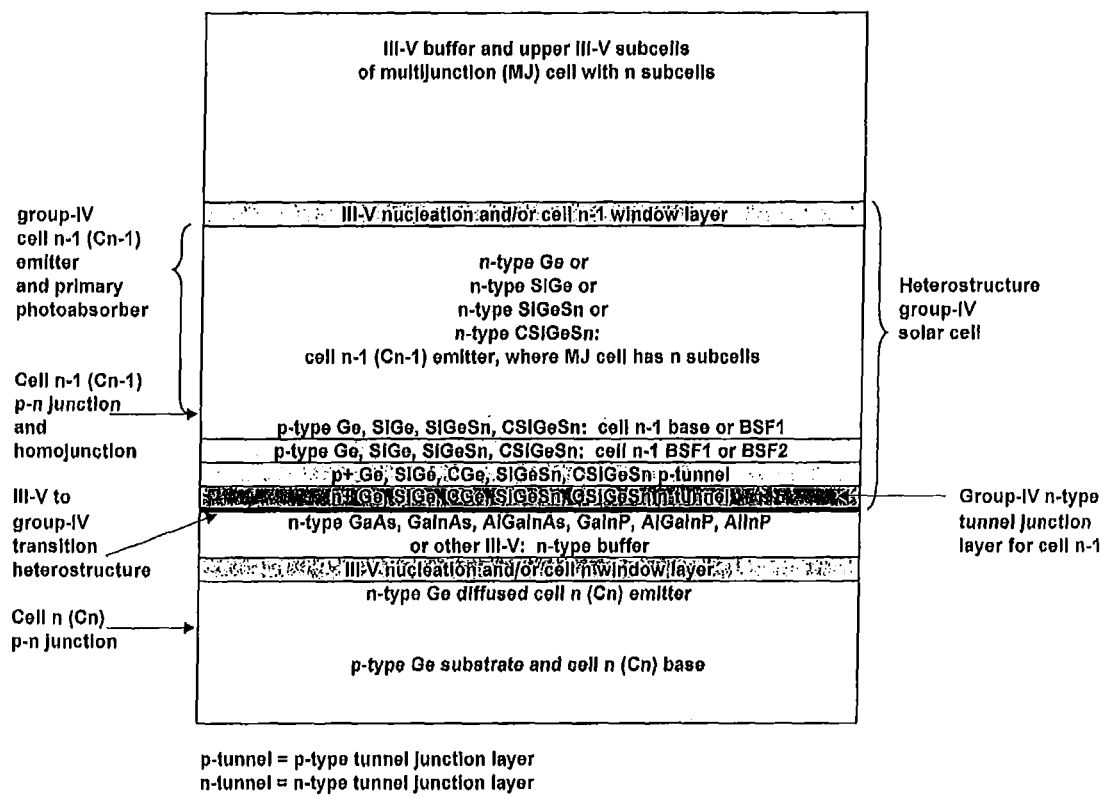

FIG. 10 is a cross-sectional diagram of a group-IV solar cell where the primary photoabsorber is a group-IV semiconductor material forming a solar cell emitter shown as n-type in the figure, and with a group-IV base layer shown as p-type in the figure and forming a homojunction p-n junction with the group-IV emitter layer, with a group-IV tunnel junction layer shown as n-type in the figure, and with a III-V buffer layer shown as n-type in the figure and that forms a cross-column heterostructure between the group-IV tunnel junction layer and the III-V semiconductor buffer layer.

Figure 11:
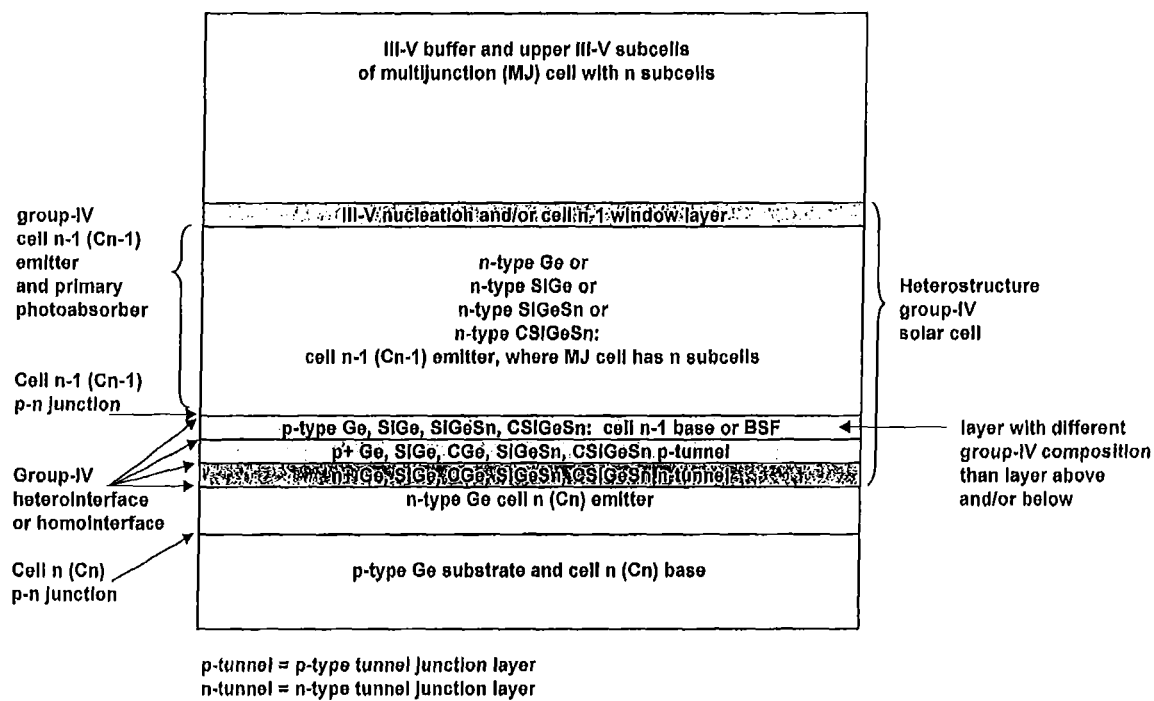

FIG. 11 is a cross-sectional diagram of a group-IV solar cell where the primary photoabsorber is a group-IV semiconductor material forming a solar cell emitter shown as n-type in the figure, with a group-IV base, BSF, or back-heterostructure layer shown as p-type in the figure having a different composition than the layers above and/or below it, and that forms a group-IV heterostructure between the group-IV emitter layer and the group-IV base, BSF, or back-heterostructure.

Figure 12:
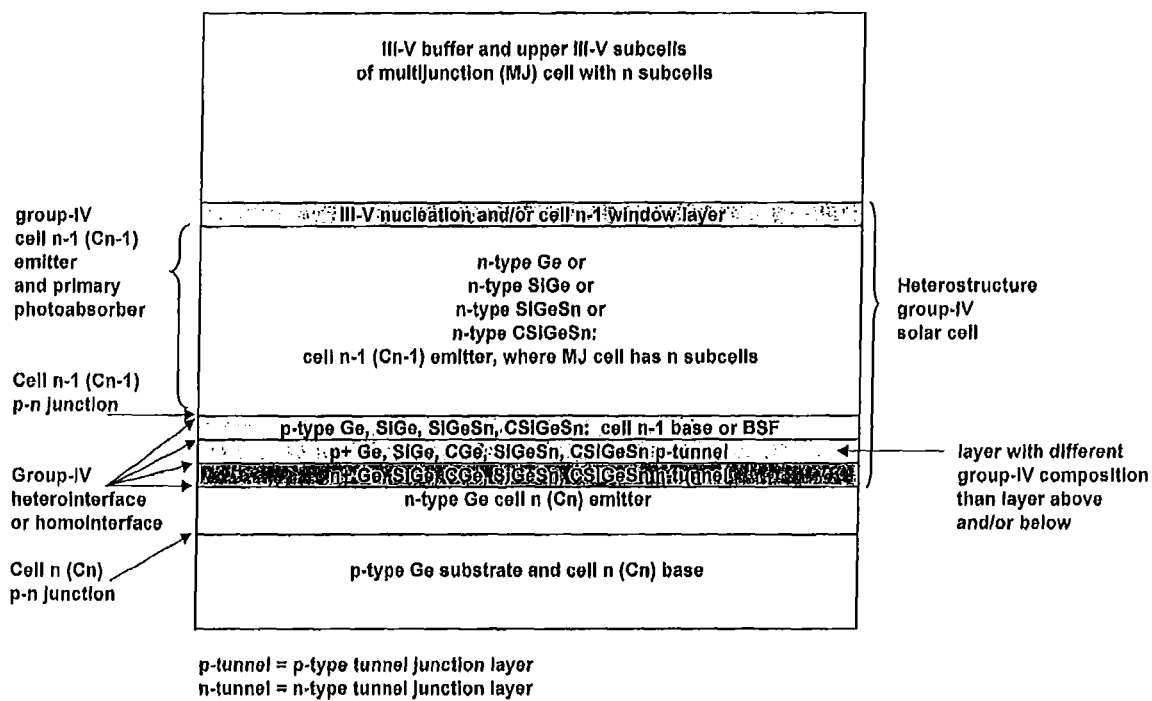

FIG. 12 is a cross-sectional diagram of a group-IV solar cell where the primary photoabsorber is a group-IV semiconductor material forming a solar cell emitter shown as n-type in the figure, and with a group-IV base, BSF, or back-heterostructure layer shown as p-type in the figure, with a group-IV tunnel junction layer shown as p-type in the figure having a different composition than the layers above and/or below it, and that forms a group-IV heterostructure between the group-IV base, BSF, or back-heterostructure layer and the group-IV tunnel junction layer.

Figure 13:
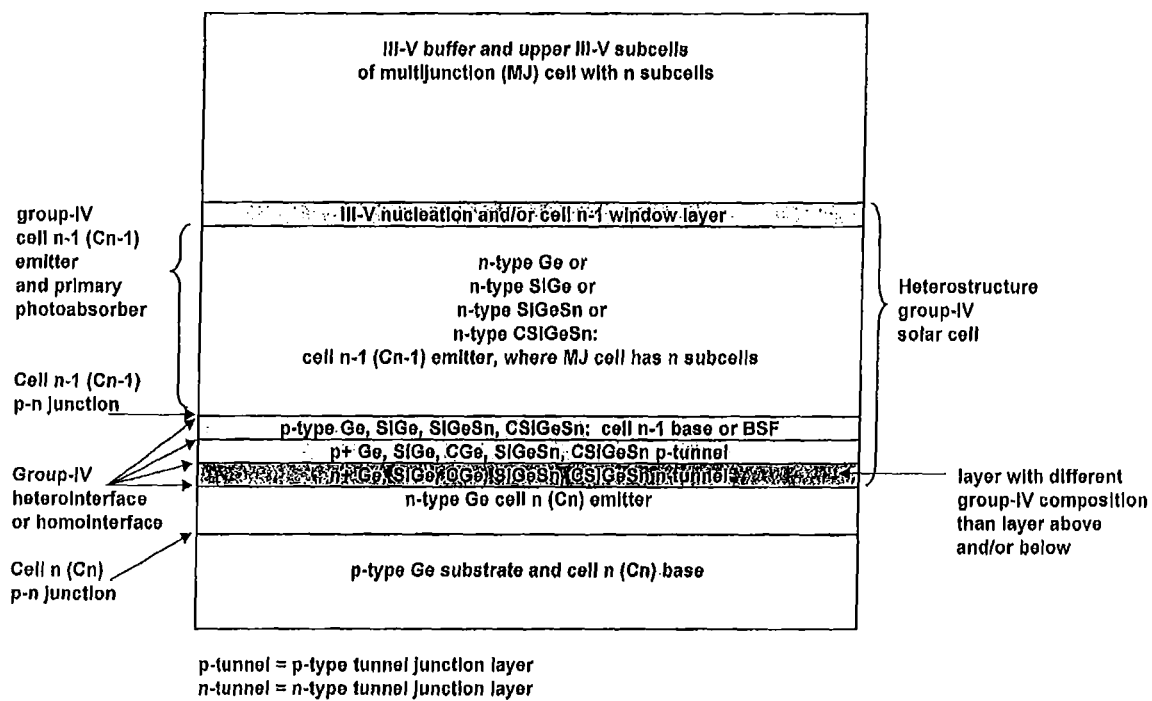

FIG. 13 is a cross-sectional diagram of a group-IV solar cell where the primary photoabsorber is a group-IV semiconductor material forming a solar cell emitter shown as n-type in the figure, and with a group-IV first tunnel junction layer shown as p-type in the figure, with a group-IV second tunnel junction layer shown as n-type in the figure having a different composition than the layers above and/or below it, and that forms a group-IV heterostructure between the group-IV semiconductor, first, p-type tunnel junction layer (p-tunnel) and the group-IV semiconductor, second, n-type tunnel junction layer (n-tunnel).

Figure 14:
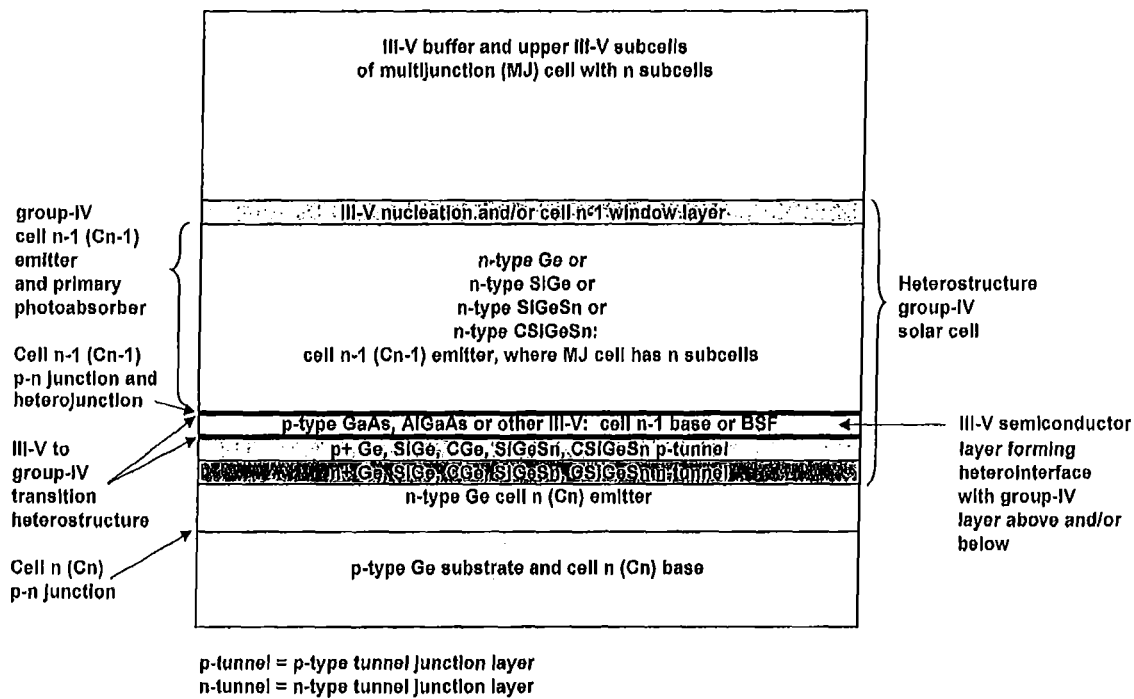

FIG. 14 is a cross-sectional diagram of a group-IV solar cell where the primary photoabsorber is a group-IV semiconductor material forming a solar cell emitter shown as n-type in the figure, with a III-V semiconductor base, BSF, or back-heterostructure layer shown as p-type in the figure which forms a first cross-column heterostructure with the group-IV emitter, and with a group-IV semiconductor tunnel junction layer shown as p-type in the figure that forms a second cross-column heterostructure with the III-V base, BSF, or back-heterostructure layer.

Figure 15:
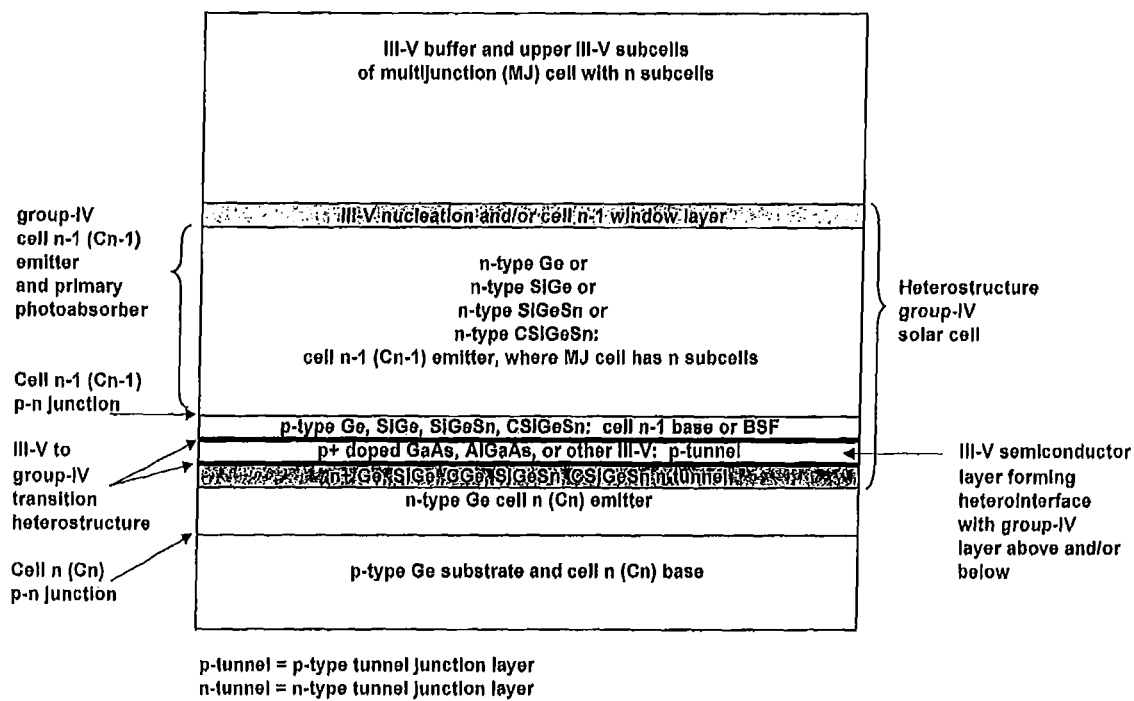

FIG. 15 is a cross-sectional diagram of a group-IV solar cell where the primary photoabsorber is a group-IV semiconductor material forming a solar cell emitter shown as n-type in the figure, with a group-IV base, BSF, or back-heterostructure layer shown as p-type in the figure, with a III-V semiconductor first tunnel junction layer shown as p-type in the figure which forms a first cross-column heterostructure with the group-IV base, BSF, or back-heterostructure, and with a group-IV second tunnel junction layer shown as n-type in the figure that forms a second cross-column heterostructure with the III-V first tunnel junction layer.

Figure 16:
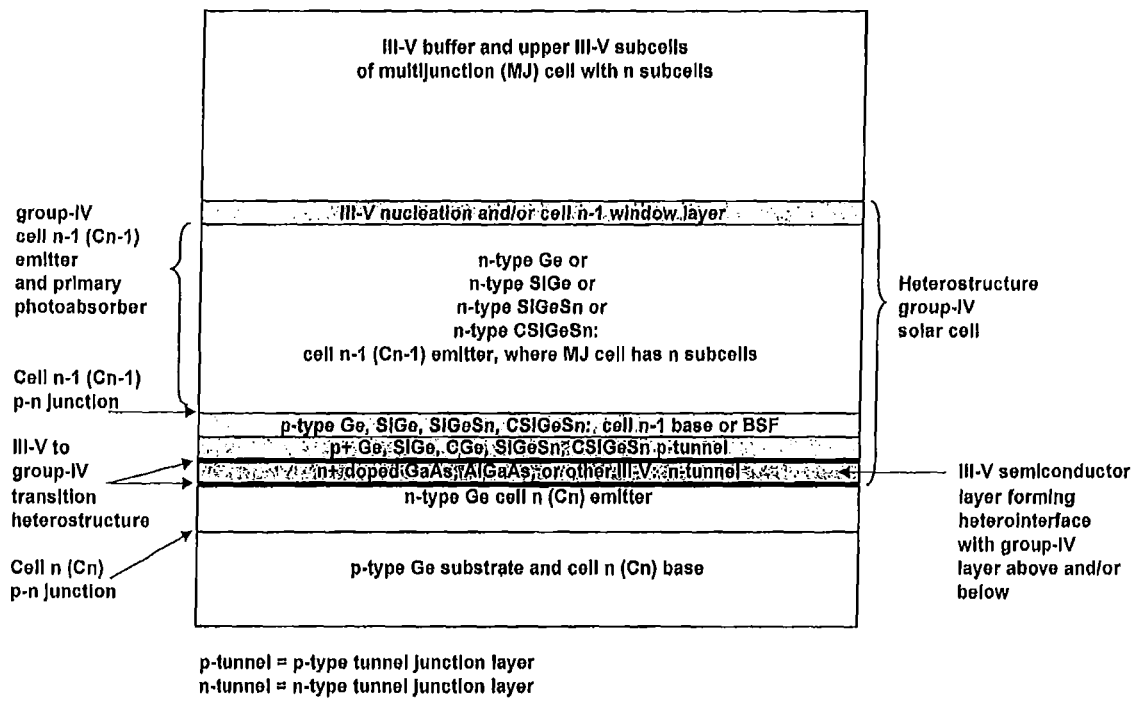

FIG. 16 is a cross-sectional diagram of a group-IV solar cell where the primary photoabsorber is a group-IV semiconductor material forming a solar cell emitter shown as n-type in the figure, with a group-IV first tunnel junction layer shown as p-type in the figure, with a III-V semiconductor second tunnel junction layer shown as n-type in the figure which forms a first cross-column heterostructure with the group-IV first tunnel junction layer, and with a group-IV buffer layer shown as n-type in the figure that forms a second cross-column heterostructure with the III-V second tunnel junction layer.

Figure 17:
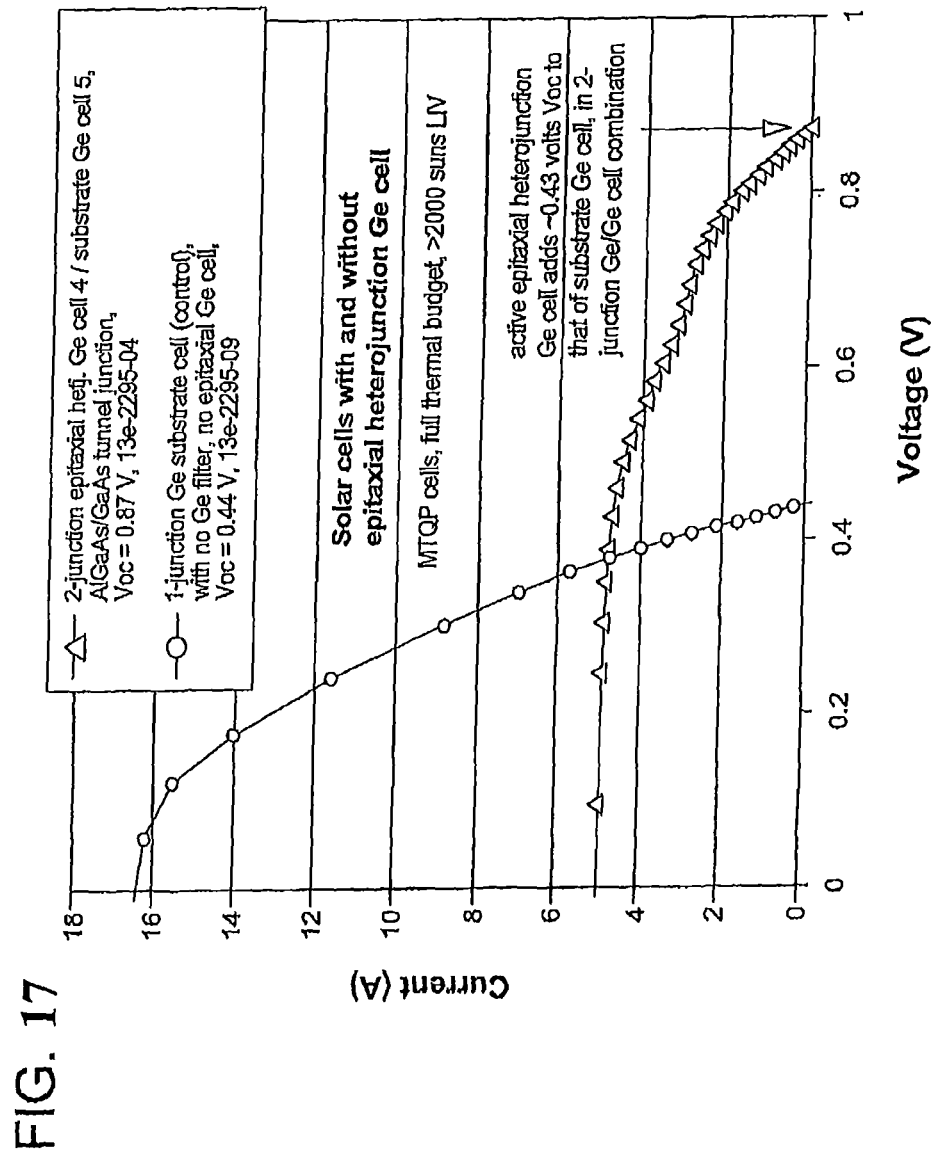
Figure 18:
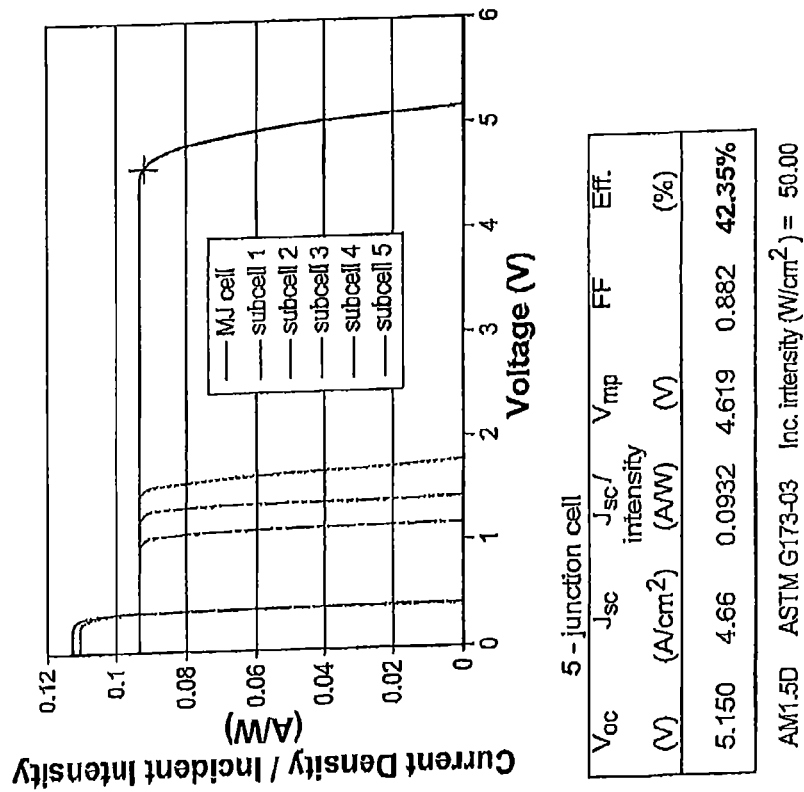
Figure 18:
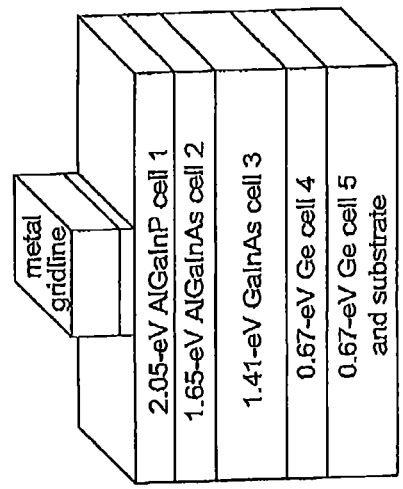
Figure 19:
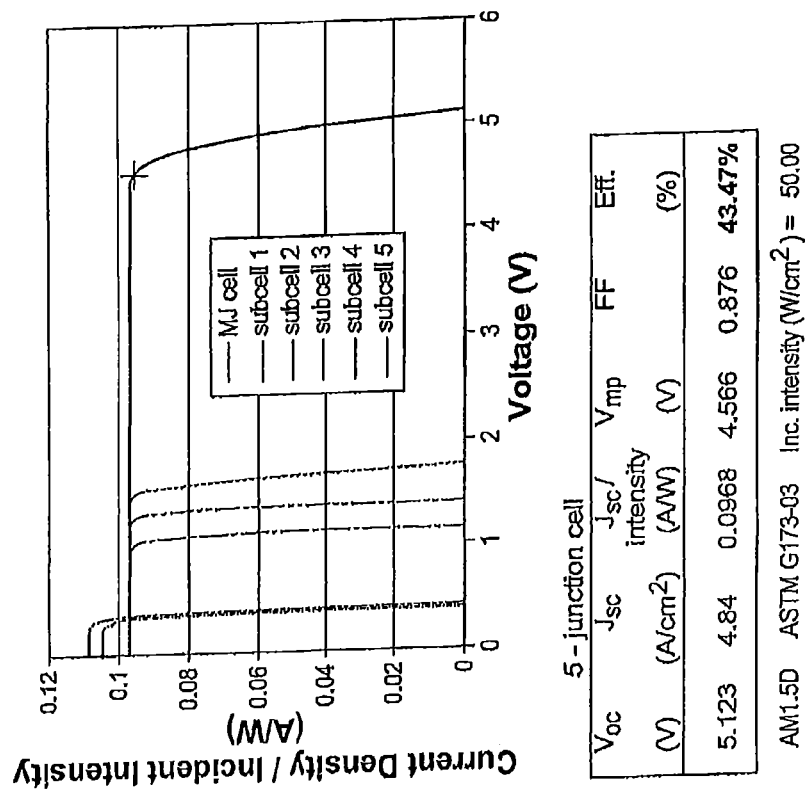
Figure 19:
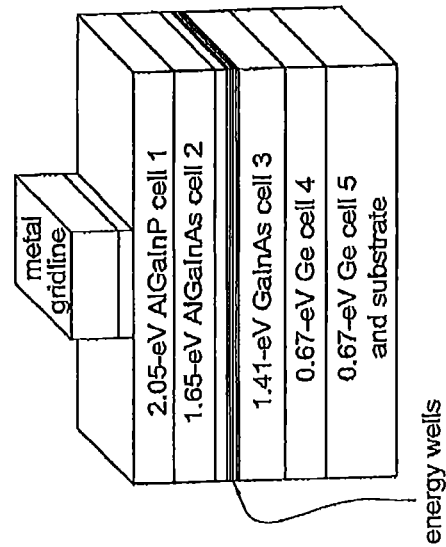
Figure 20:
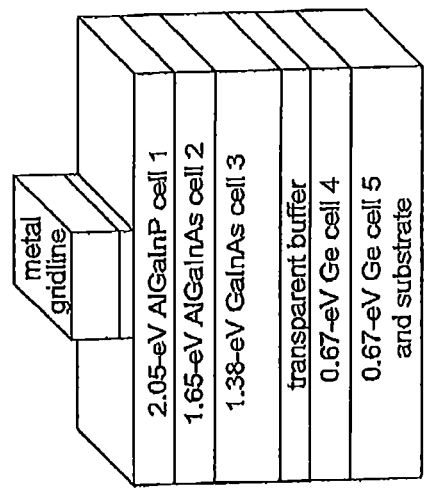
Figure 20:
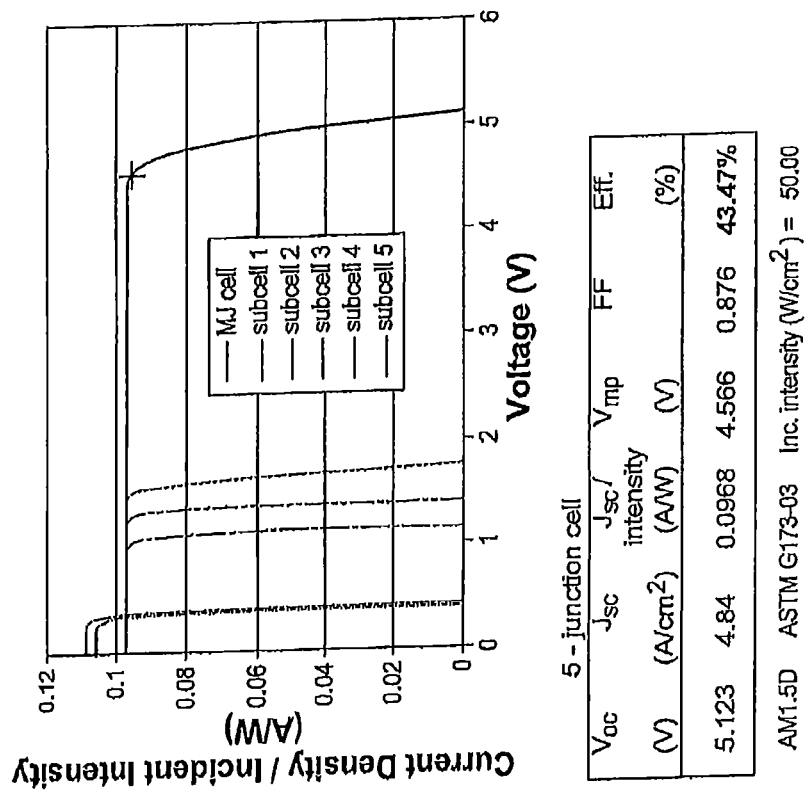
Figure 21:
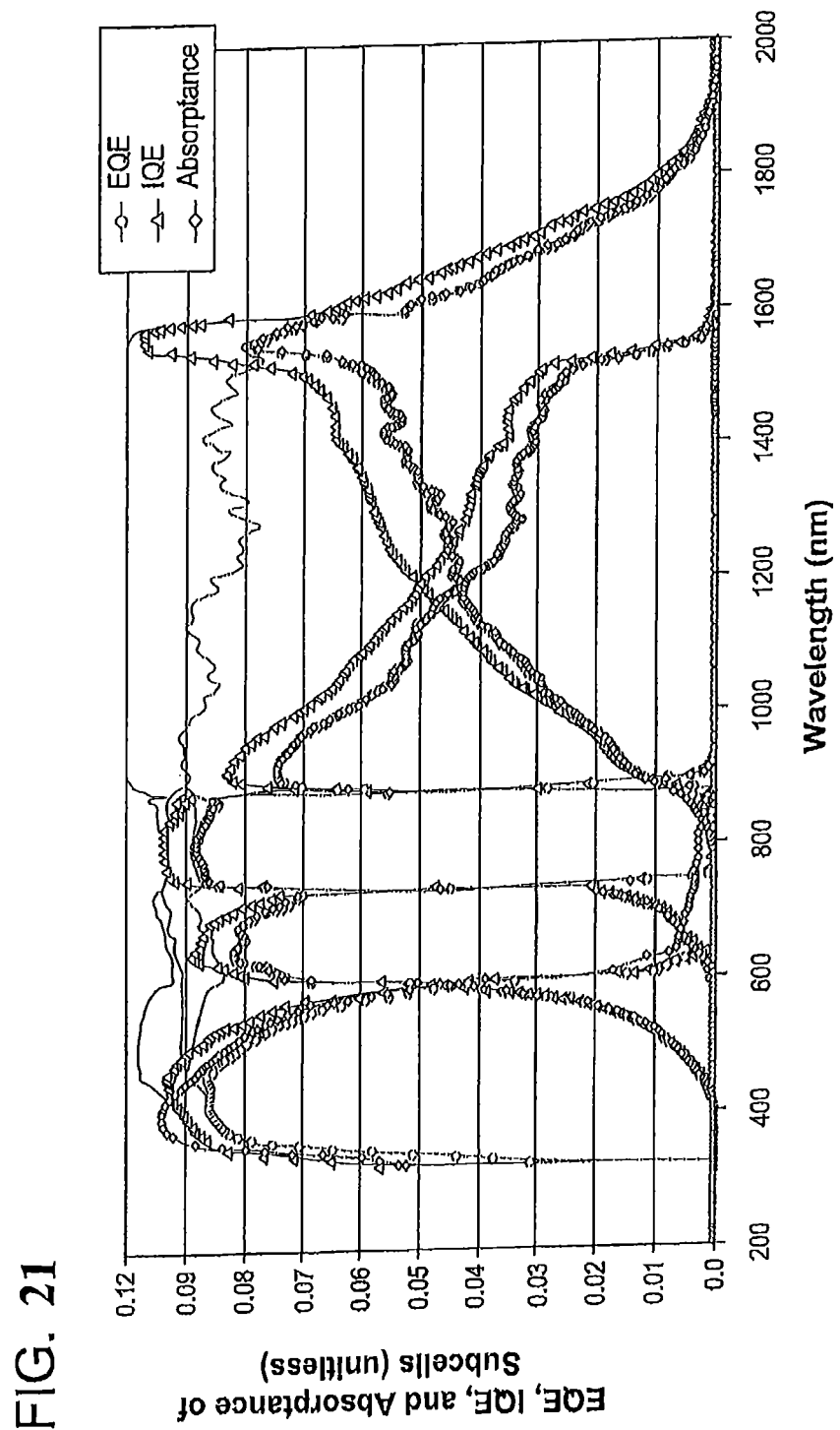
Figure 22:
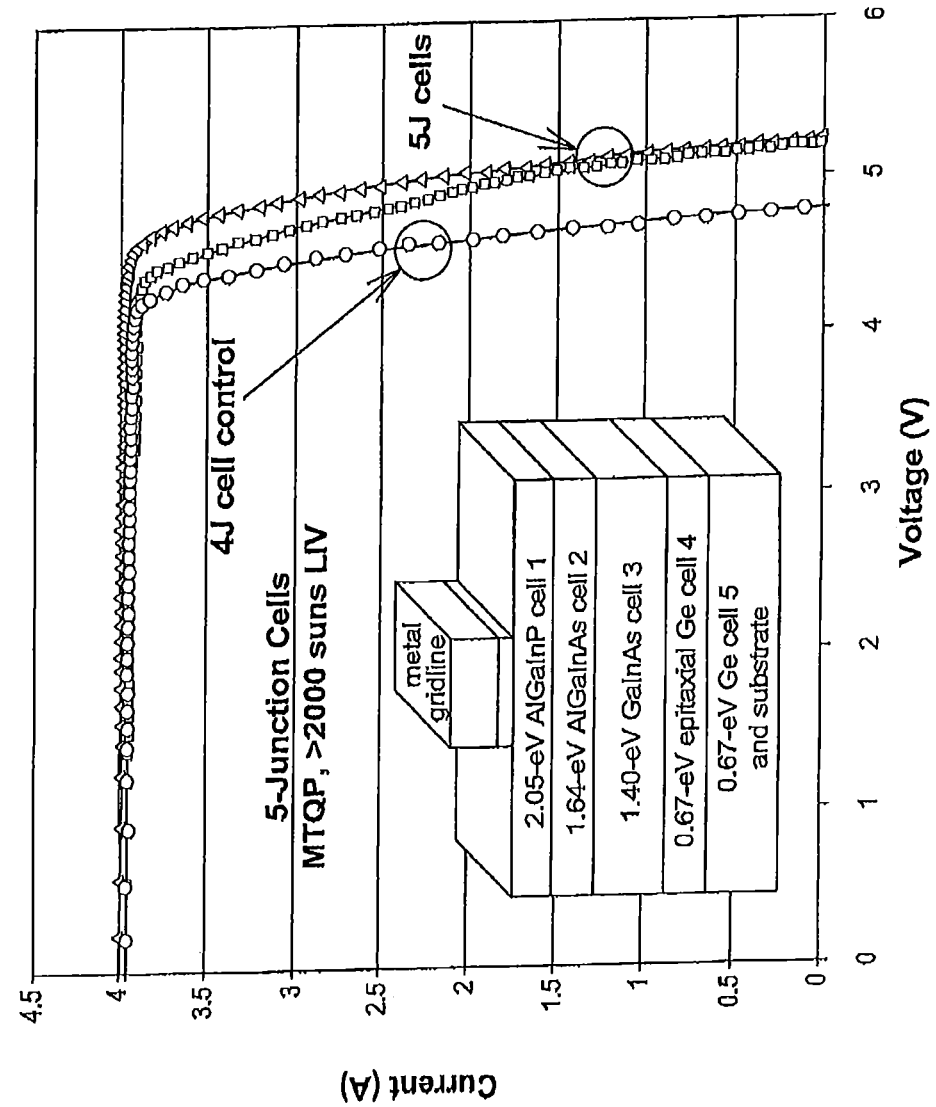

FIG. 17 is a graph plotting experimental, measured light I-V curves of a 2-junction (2J) Ge/Ge subcell with an interconnecting AlGaAs/Ga?As tunnel junction with both subcells active in a structure similar to that shown in FIG. 4 with an epitaxially-grown Ge absorber layer in the upper group-IV subcell, showing the voltage addition associated with the series interconnection of both active group-IV subcells. A single-junction (1J) Ge subcell formed in the Ge substrate is also plotted for comparison. The 2-junction Ge/Ge cell structure results in approximately twice the voltage of the 1-junction Ge cell, with over 0.4 V higher open-circuit voltage $V_{oc}$ for the 2J Ge/Ge cell compared to the 1J cell;

FIG. 18 is a cross-sectional diagram and graph showing calculated subcell and multijunction cell light I-V curves and calculated light I-V parameters for a 5-junction (5J) AlGaInP/AlGaInAs/GaInAs/Ge/Ge solar cell using an epitaxial Ge cell 4 and a 2-junction Ge/Ge combination for the bottom two cell layers;

FIG. 19 cross-sectional diagram and graph showing calculated subcell and multijunction cell light I-V curves and calculated light I-V parameters for a 5-junction (5J) with an epitaxial Ge cell 4 and a 2-junction Ge/Ge cell configuration at the bottom of the stack, and with energy wells to lower the effective bandgap of subcell 3;

FIG. 20 is a cross-sectional diagram and graph showing calculated subcell and multijunction cell light I-V curves and calculated light I-V parameters for a 5-junction (5J) cell using an epitaxial Ge cell 4 and a 2-junction Ge/Ge cell configuration at the bottom of the stack, and with a metamorphic structure to lower the bandgap of subcell 3;

FIG. 21 is a graph showing calculated external quantum efficiency (EQE), internal quantum efficiency (IQE), and an overall absorptance for a 5-junction cell incorporating an epitaxial heterojunction Ge cell 4, with an AlGaInP/AlGaInAs/GaInAs/epitaxial Ge/substrate Ge cell structure, with a base bandgap combination of 2.05/1.68/1.41/0.67/0.67 eV; and FIG. 22 is a graph showing measured light I-V characteristics of two fully-integrated prototype 5-junction (5J) cells, incorporating a heterojunction epitaxial Ge cell 4, with structure as shown in the cross-sectional cell schematic. 4-junction (4J) cells with an identical structure except that the epitaxial Ge cell 4 and associated tunnel junction are absent are also shown for comparison. The epitaxial Ge cell 4 in the 5J cells results in an ~0.4 V higher open-circuit voltage $V_{oc}$ for the 5J cells compared to the 4J cells.

DETAILED DESCRIPTION

According to the present disclosure, systems and methods are disclosed for making significant improvements for terrestrial and non-terrestrial photovoltaic cells, such as, for example, concentrator solar cells and space solar cells, providing significantly higher efficiency than are available in today's most advanced solar cells. The approaches described herein make use of the lower-cost, more reliable, and more scalable processes of upright solar cell growth, and lattice-matched growth or metamorphic growth with small lattice mismatch, as opposed to the inverted cell growth and cell processing, and metamorphic growth with high lattice mismatch of inverted metamorphic cells.

The present disclosure allows the formation of multijunction cells, such as, for example, 3-junction (3J), 4-junction (4J), 5-junction (5J), 6-junction (6J), 7-junction (7J) solar cells, or cells with 8 junctions or more that incorporate a group-IV solar cell. Preferred cells comprise, for example, epitaxial Ge, Si, SiGe, CGe, GeSn, SiGeSn, CSiGe, CGeSn, CSiGeSn, etc. to provide the desired, pre-selected subcell bandgap combination, thus increasing the efficiency of the multijunction cell. Such group-IV solar cells at least one layer comprising at least one element from column IV (four) of the periodic table of elements, e.g., carbon (C), silicon (Si), germanium (Ge), and tin (Sn). The group-IV layer in the solar cell may be a primary photogeneration layer, or primary absorber layer, such that the majority of charge carrier photogeneration for the solar cell takes place in the primary absorber layer.

The approaches described herein make use of the low-cost, reliable, and scalable processes of upright solar cell growth, and lattice-matched growth or metamorphic growth with small lattice mismatch. These processes have certain advantages compared with inverted cell growth and cell processing, and metamorphic growth with high lattice mismatch, associated with other high-efficiency solar cell architectures, such as, for instance, inverted metamorphic cells.

According to the present disclosure, the heterostructure layers are designed to reduce minority-carrier recombination at interfaces, and be more transparent to light in layers where photoregeneration is undesirable, such as, for example, tunnel junction layers, window layers, base or BSF layers, and other layers in which the collection probability of photogenerated carriers is low.

Further, according to the present disclosure, dopant or other impurity diffusion from one layer to another is engineered or managed. In cases where it is desirable, doping of group-IV semiconductor layers by nearby III-V semiconductors, and doping of III-V semiconductor layers by nearby group-IV semiconductors, is used to form the final doping of some solar cell layers. In other cases for which doping caused by adjacent layers is undesirable, dopant or other impurity diffusion from one layer to another is inhibited by choice of the layer structure, compositions, growth conditions, and processing conditions.

Moreover, according to the present disclosure, when such group-IV layers are incorporated into multijunction cells with III-V semiconductor layers, the group-III and group-V elements in the III-V semiconductors will typically dope nearby group-IV layers. Similarly, the group-IV elements will dope the III-V semiconductor layers. Such doping between semiconductor layers from different columns of the periodic table, referred to herein as cross-doping, is often difficult to avoid and results in compromised cell efficiency for some cell designs. However, the cell designs disclosed herein use particular groupings of multijunction solar cell device design architectures with regard to: n-type or p-type doping type and doping concentration, semiconductor family (group-IV semiconductors, III-V semiconductors, II-VI semiconductors, etc.), semiconductor material compositions and lattice constant, location in the multijunction stack, selection of adjacent semiconductor layers, semiconductor growth conditions and thermal budget and annealing conditions that influence the incorporation and movement of dopant atoms, crystal lattice strain, relaxation, and dislocations, and other parameters as described in the present disclosure to accommodate such cross-doping and use it to advantage to result in the final doping of the solar cell layers, resulting in a solar cell having significantly improved voltage and efficiency.

In addition, according to the present disclosure, better use is also made of the excess photogenerated current in the Ge bottom subcell as compared with conventional lattice-matched GaInP/GaIn As/Ge 3-junction solar cells. Another cell type that makes better use of the excess photogenerated current density in the Ge bottom subcell of conventional 3J cells is represented by inverted metamorphic solar cells such as GaInP/GaAs/GaInAs 3J cells. However, this approach has significantly higher growth cost and processing cost than the upright processing and lattice-matched growth approaches described and disclosed herein. For example, the present disclosure also contemplates, for example, using dilute nitride GaInNAs(Sb) subcells with ~1-eV bandgap in multijunction cells as another method for achieving a better division of the solar spectrum in the long wavelength range of the solar spectrum. However, such dilute-nitride cells have historically had unacceptably low current density, voltage, or both to be used in this way, unless higher cost growth methods are used.

The term group-IV solar cell refers to a solar cell having at least one layer comprising one or more group-IV elements, e.g., C, Si, Ge, and Sn, individually, or in combination with other elements. The group-IV solar cell layer may be selected, for instance, from a group including the semiconductor compositions of Ge, Si, SiGe, CGe, GeSn, SiGeSn, CSiGe, CGeSn, or CSiGeSn. The GaInP nucleation layer on the group-IV solar cell in many of the diagrams below can be used as a window layer on the cell in addition to serving as a nucleation layer. The abbreviations C1, C2, C3, C4, C5, etc. refer to subcell or cell 1 (the top subcell), and subcells or cells 2, 3, 4, 5, etc., respectively, beneath the top cell in normal operation of a multijunction solar cell. The abbreviations 1J, 2J, 3J, 4J, 5J, 6J, 7J, etc, refer to 1-junction, 2-junction, 3-junction, 4-junction, 5-junction, or 6-junction, 7-junction, etc., solar cells.

Some variants of the present disclosure will now be described more fully hereinafter with reference to the accompanying drawings, in which some, but not all variations of the disclosure are shown. Indeed, the present disclosure may be embodied in many different forms and should not be construed as limited to the variations set forth herein. Instead, these illustrative variations are provided so that this disclosure will be thorough and complete, and will fully convey the scope of the disclosure to those skilled in the art. For example, unless otherwise indicated, referencing something as being a first, second or the like should not be construed to imply a particular order. Also, something may be described as being "above" something else and, unless otherwise indicated, may instead be "below", and vice versa. Similarly, something described as being to the left of something else may instead be to the right, and vice versa. Like reference numerals refer to like elements throughout.

Therefore, preferred embodiments according to the present disclosure include a group-IV solar cell that is optically thin in order to leak a substantial, amount of light to an additional subcell layer beneath, such as, for example, an epitaxially-grown Ge, SiGe, CGe, GeSn, SiGeSn or CSiGeSn subcell on top of a Ge substrate subcell in a multijunction solar cell, in which most or substantially all of the photoabsorbing group-IV layer in the solar cell is doped n-type by the growth of III-V subcells on top and/or by III-V semiconductor layers on which the group-IV solar cell is grown, such that the p-n junction is formed at the back of the main photoabsorbing group-IV layer.

An optically thin solar cell is one which transmits a non-zero amount of the light incident upon it to layers beneath the solar cell, i.e., to layers on the opposite side of the subcell from the light source. Typically, an optically thin subcell will transmit an amount of incident light in the range of approximately 5% to 90% of the light intensity or equivalent photogenerated current density that could in principle be used by a solar cell with that bandgap. The light intensity or equivalent photogenerated current density that could in principle be used by a solar cell with a given bandgap, is the light in the spectrum incident on the cell—including the effects of any light filtering above the cell, for instance, from other subcells in a multijunction solar cell stack—with photon energy high enough to produce carrier photogeneration in the solar cell, i.e., higher than approximately the solar cell bandgap. More typically, the range of the amount of light transmitted by an optically thin solar cell is approximately 10% to 70%, and will depend on the desired use of the light transmitted by the solar cell, for instance, by the specific bandgap combination of subcells in a multijunction cell beneath the optically thin subcell. For many of the solar cell designs in the present disclosure, in which an upper group-IV solar cell and a lower group-IV solar cell are to share the available photogenerated current density equally, in order for the upper and lower subcells to be current matched in a multijunction solar cell, the upper, optically thin cell will preferably have a range of the amount of transmitted light of approximately 40% to 65%, and more preferably 45% to 60%, and still more preferably 48% to 56%. The desired amount of light to be transmitted by the optically thin upper subcell depends on non-ideal effects in the solar cell structure, such as absorption by intervening layers like the tunnel junction layers between the upper and lower subcell, and incomplete collection of photogenerated carriers in the lower subcell.

Further examples include a group-IV photovoltaic cell, such as, for example a solar cell where the main or primary photogeneration layer is an epitaxially-grown Ge, SiGe, CGe, GeSn, SiGeSn, or CSiGeSn n-type emitter layer, doped n-type by the nucleation and growth of III-V semiconductors on top of it, from which photogenerated minority holes are collected at a p-n junction at the back of this n-type Ge, SiGe, CGe, GeSn, SiGeSn, or CSiGeSn emitter layer.

In addition, the present disclosure contemplates a photovoltaic cell arrangement with the n-type Ge, SiGe, CGe, GeSn, SiGeSn or CSiGeSn emitter solar cell described above, and preferably having a thickness in the range of from about 0.01 to about 10 microns, more preferably in the range of from about 0.1 to about 2 microns, and still more preferably in the range of from about 0.3 to about 0.7 microns.

Figure 1:
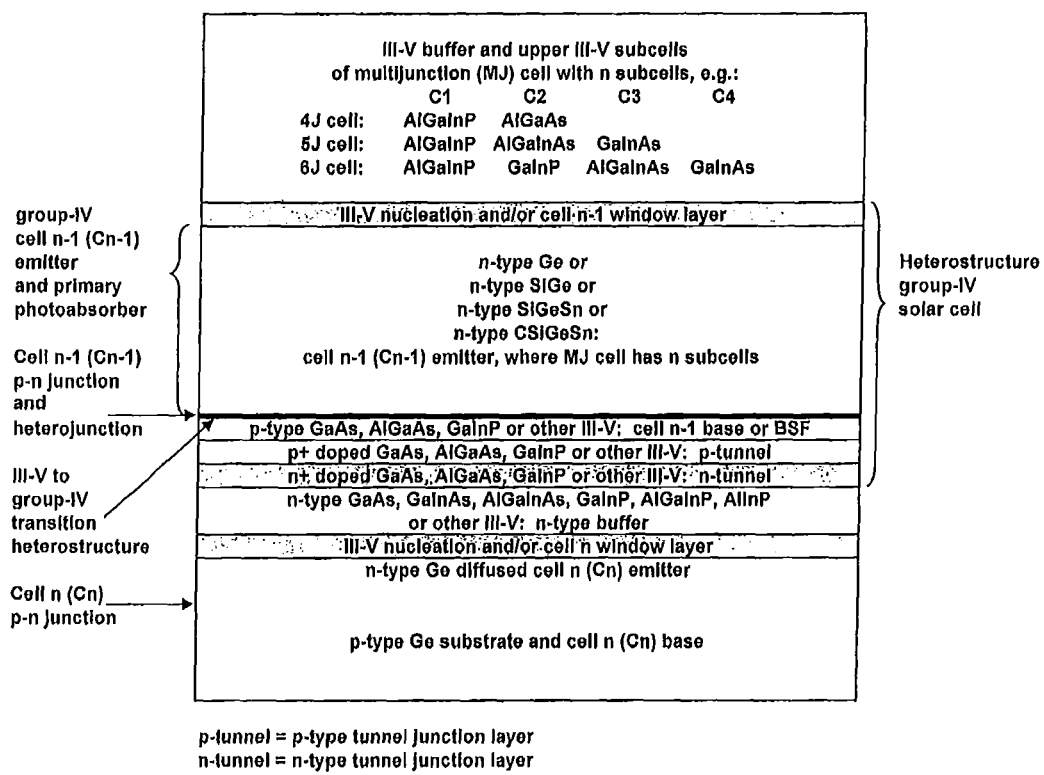

Further, the present disclosure contemplates a photovoltaic cell arrangement with the n-type Ge, SiGe, CGe, GeSi, SiGeSn, or CSiGeSn emitter solar cell described above, and where the p-n junction at the back of the emitter layer is formed by a p-type III-V layer that renders ineffective the n-type doping that diffuses in from the front of the cell (since the group-V elements that cause n-type doping and group-III elements that cause p-type doping in group-IV semiconductors are not dopants in III-V semiconductors). As shown in FIG. 1, the n-type Ge, SiGe, CGe, GeSi, SiGeSn, or CSiGeSn emitter solar cell is located above the lower subcell, where above indicates a direction toward the primary light source for the solar cell, e.g., the sun, where the p-n junction at the back of the emitter layer is a heterojunction between the n-type group-IV emitter and a p-type III-V semiconductor base, back-surface-field (BSF), or back-heterostructure layer comprising a III-V semiconductor such as, but not limited to, GaAs, AlGaAs, GaInAs, GaInP, AlGaInAs, and AlGaInP. The n-type group-IV layer may be doped by group-V elements from III-V semiconductor layers beneath it and group-V elements from III-V semiconductors above it, and the n-type group-IV emitter layer forms the p-n junction of the solar cell at a heterostructure between the n-type Ge, SiGe, CGe, GeSn, SiGeSn, or CSiGeSn emitter and p-type GaAs base or BSF layer. Furthermore, the heterostructure formed between the group-IV emitter and the III-V semiconductor base, BSF, or back-heterostructure in FIG. 1 is a cross-column heterostructure.

The III-V semiconductor base, BSF, or back-heterostructure layer material, and indeed the material of any or all the III-V semiconductor layers described in various configurations the semiconductor devices of the present disclosure, may be chosen from a preferred group including, but not limited to: GaAs, AlGaAs, GaInAs, AlGaInAs, InP, GaP, GaInP, GaInPAs, AlInP, AlGaInP, InAs, InPAs, AlInas, AlAs, GaSb, GaAsSb, InSb, GaInAsSb, GaInNAs, GaInNAsSb, GaN, AlN, InN, GaInN, AlGaN, AlInN, AlGaInN, and combinations thereof.

In general, a back-surface-field (BSF) layer may have the same bandgap as the base layer, or it may have a different bandgap than the base layer, in which case the BSF layer is also a back-heterostructure layer. The solar cell BSF layer typically has the same doping type as the solar cell base. The BSF layer is often, but not always, doped at a higher doping concentration with respect to the base layer in order to suppress the concentration of minority-carriers and suppress their rate of recombination in the BSF layer. The BSF layer often, but not always, has a higher bandgap with respect to the base layer in order to suppress the concentration of minority-carriers and suppress their rate of recombination in the BSF layer.

In general, a cross-column heterostructure is a heterostructure formed between: a first semiconductor layer on a first side of the heterostructure comprising a first family of semiconductors formed from elements from a given column or set of columns of the periodic table of elements, and; a second semiconductor layer on the opposite, second side of the heterostructure comprising a second family of semiconductors different from the first family of semiconductors of the first semiconductor layer, formed from elements from a column or different set of columns of the periodic table, where the family of semiconductors for each layer may be selected from a group including, but not limited to: group-IV semiconductors; III-V semiconductors; II-VI semiconductors; I-III-VI semiconductors; II-IV-VI semiconductors; and other families, where the roman numerals refer to the number of a column of elements in the periodic table of elements.

Figure 2:
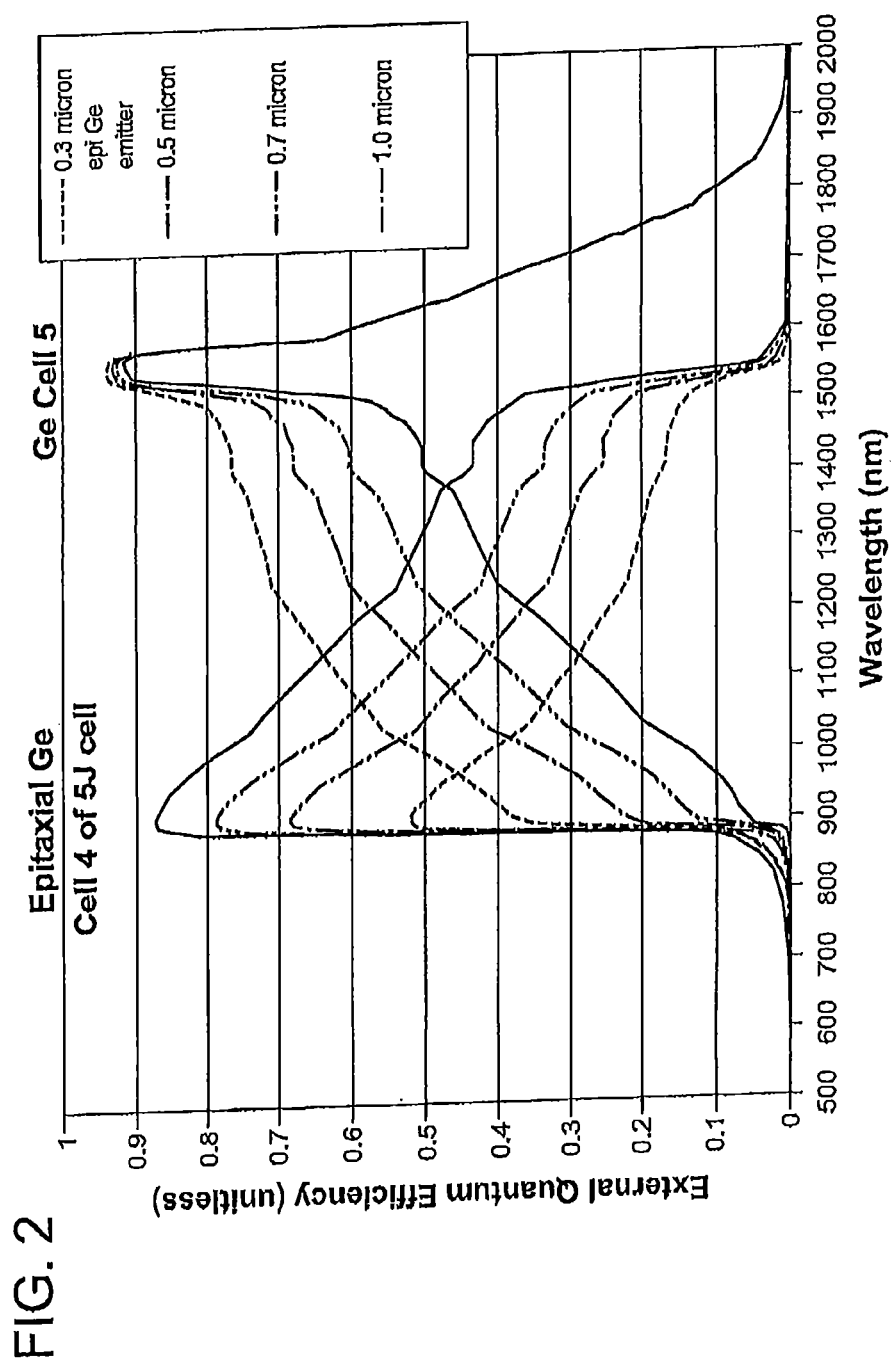
FIG. 2 is a graph showing calculated quantum efficiencies of a thin, epitaxial Ge subcell 4 in a 5-junction cell, and of an optically thick lower Ge substrate cell 5 in a 5-junction cell showing the behavior of the resulting current balance among these subcells as a function of upper subcell thickness.
Figure 3:
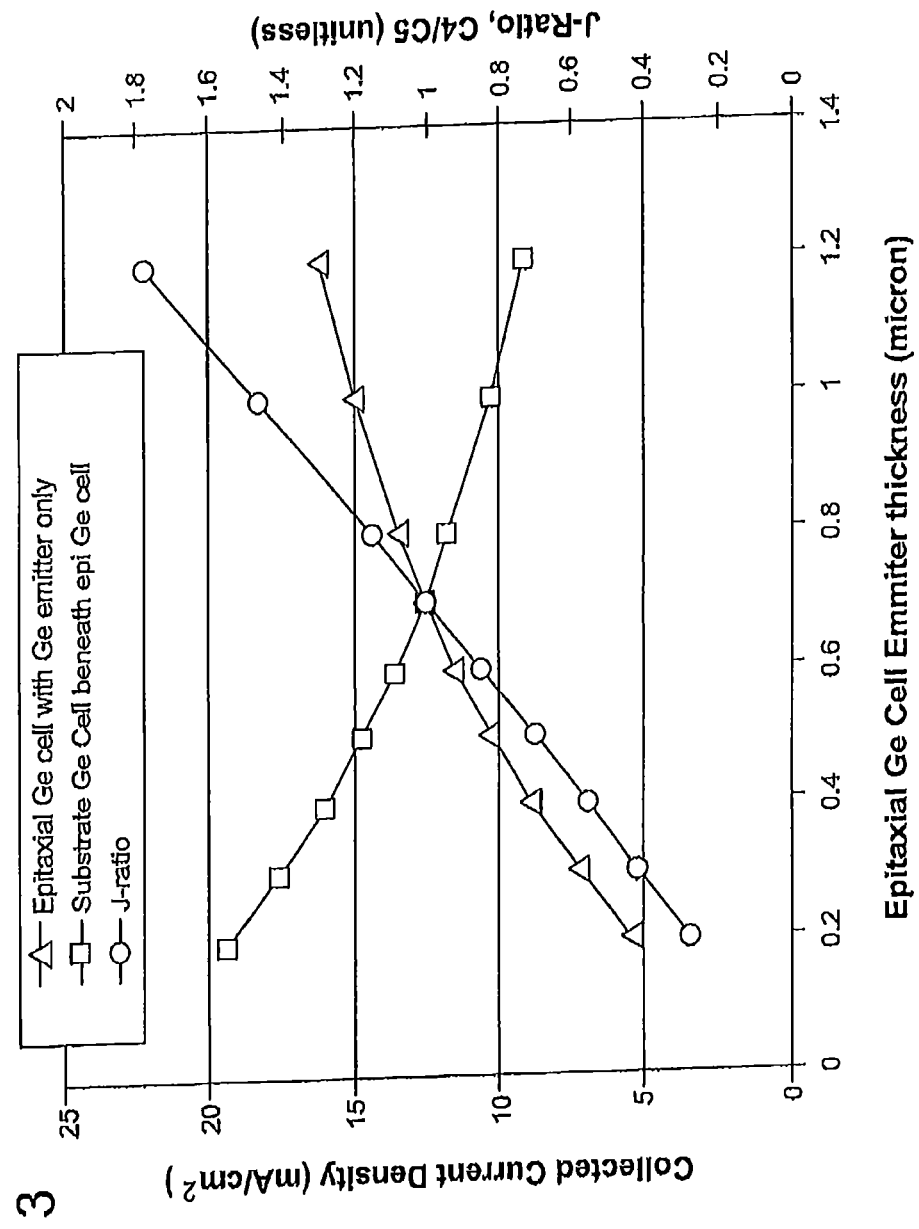
FIG. 3 is a graph showing calculated densities of both upper and lower group-IV subcells from FIG. 2 and the ratio of their currents (J-ratio) plotted as a function of upper group-IV subcell absorber thickness.

Still further, the present disclosure contemplates an upper group-IV solar cell that is optically thin, that transmits roughly half of the light energy incident upon it to a second lower group-IV solar cell positioned beneath the first, upper group-IV cell, such that it is in optical series with the first cell. The upper group-IV cell and the lower group-IV cell may be connected in electrical series by a tunnel junction preferably made as transparent as possible to the wavelengths used by the second, lower cell. As shown in FIG. 2, calculated quantum efficiencies of a thin, upper, epitaxial Ge subcell 4 in a 5J cell, and of an optically thick, lower Ge substrate subcell 5 in a 5J cell, are plotted as a function of wavelength for various upper subcell thicknesses using Ge absorption coefficients. The behavior of the resulting current balance among these subcells for various upper subcell thicknesses can be seen in FIG. 2 as a function of upper subcell thickness. The current densities of both the upper and lower group-IV subcells from FIG. 2, and the ratio of their currents, called the J-ratio, is plotted as a function of upper group-IV subcell absorber thicknesses in FIG. 3.

A description of a number of configurations for the group-IV heterostructure solar cell now follows, where the group-IV heterostructure solar cell configurations are shown for the particular case in which the group-IV heterostructure solar cell is a subcell within a multijunction solar cell, and in which the group-IV heterostructure solar cell has an n-type group-IV solar cell emitter in which the majority of the photogeneration and/or photocurrent collection in the group-IV heterostructure solar cell takes place.

Note that the present disclosure also contemplates a group-IV solar cell in which layers in the solar cell other than the emitter layer may be the primary photogeneration layer of the solar cell, i.e. the layer in which the majority of the photogeneration and/or photocurrent collection in the group-IV solar cell takes place. For example, the group-IV solar cell may have a base layer comprising a group-IV semiconductor such as Ge, SiGe, CGe, GeSn, SiGeSn, or CSiGeSn, where the base layer is the primary photogeneration layer of the solar cell. The group-IV solar cell with the majority of photogeneration and/or photocurrent collection in a solar cell layer other than the emitter layer, such as in a group-IV solar cell base layer, may have a have a group-IV semiconductor emitter, which may form a homojunction or a heterojunction with the group-IV semiconductor base at the p-n junction of the solar cell.

FIG. 4 is a cross-sectional diagram of a group-IV solar cell where the primary photoabsorber is a group-IV semiconductor material forming a solar cell emitter shown as n-type in the figure, and with a group-IV base, BSF, or back-heterostructure layer shown as p-type in the figure, and a III-V tunnel junction layer formed from a III-V semiconductor material and shown as p-type in the figure, forming a cross-column heterostructure between the group-IV base, BSF, or back-heterostructure and the III-V tunnel junction layer.

FIG. 5 is a cross-sectional diagram of a group-IV solar cell where the primary photoabsorber is a group-IV semiconductor material forming a solar cell emitter shown as n-type in the figure, and with a group-IV first tunnel junction layer shown as p-type in the figure, and a III-V second tunnel junction layer shown as n-type in the figure, forming a cross-column heterostructure between the group-IV semiconductor, first, p-type tunnel junction layer (p-tunnel) and the III-V semiconductor, second, n-type tunnel junction layer (n-tunnel).

FIG. 6 is a cross-sectional diagram of a group-IV solar cell where the primary photoabsorber is a group-IV semiconductor material forming a solar cell emitter shown as n-type in the figure, and with a group-IV tunnel junction layer shown as n-type in the figure, and a III-V buffer layer shown as n-type in the figure, forming a cross-column heterostructure between the group-IV tunnel junction layer and the III-V semiconductor buffer layer.

FIG. 7 is a cross-sectional diagram of a group-IV solar cell where the primary photoabsorber is a group-IV semiconductor material forming a solar cell emitter shown as n-type in the figure, and with a group-IV base layer shown as p-type in the figure and forming a homojunction p-n junction with the group-IV emitter layer, with a III-V semiconductor back-surface-field (BSF) or back-heterostructure layer shown as p-type in the figure and that forms a cross-column heterostructure between the group-IV base and the III-V BSF or back-heterostructure layer. The solar cell in the figure may also be considered to have a group-IV first BSF layer (BSF1) shown as p-type in the figure, with a III-V semiconductor second BSF (BSF2) or back-heterostructure layer shown as p-type in the figure and that forms a cross-column heterostructure between the group-IV first BSF layer and the III-V second BSF or back-heterostructure layer.

FIG. 8 is a cross-sectional diagram of a group-IV solar cell where the primary photoabsorber is a group-IV semiconductor material forming a solar cell emitter shown as n-type in the figure, and with a group-IV base layer shown as p-type in the figure and forming a homojunction p-n junction with the group-IV emitter layer, with a group-IV BSF or back-heterostructure layer shown as p-type in the figure, and with a III-V tunnel junction layer shown as p-type in the figure and that forms a cross-column heterostructure between the group-IV BSF or back-heterostructure and the III-V tunnel junction layer.

FIG. 9 is a cross-sectional diagram of a group-IV solar cell where the primary photoabsorber is a group-IV semiconductor material forming a solar cell emitter shown as n-type in the figure, and with a group-IV base layer shown as p-type in the figure and forming a homojunction p-n junction with the group-IV emitter layer, with a group-IV first tunnel junction layer shown as p-type in the figure, and with a III-V second tunnel junction layer shown as n-type in the figure and that forms a cross-column heterostructure between the group-IV semiconductor, first, p-type tunnel junction layer (p-tunnel) and the III-V semiconductor, second, n-type tunnel junction layer (n-tunnel).

FIG. 10 is a cross-sectional diagram of a group-IV solar cell where the primary photoabsorber is a group-IV semiconductor material forming a solar cell emitter shown as n-type in the figure, and with a group-IV base layer shown as p-type in the figure and forming a homojunction p-n junction with the group-IV emitter layer, with a group-IV tunnel junction layer shown as n-type in the figure, and with a III-V buffer layer shown as n-type in the figure and that forms a cross-column heterostructure between the group-IV tunnel junction layer and the III-V semiconductor buffer layer.

FIG. 11 is a cross-sectional diagram of a group-IV solar cell where the primary photoabsorber is a group-IV semiconductor material forming a solar cell emitter shown as n-type in the figure, with a group-IV base, BSF, or back-heterostructure layer shown as p-type in the figure having a different composition than the layers above and/or below it, and that forms a group-IV heterostructure between the group-IV emitter layer and the group-IV base, BSF, or back-heterostructure.

FIG. 12 is a cross-sectional diagram of a group-IV solar cell where the primary photoabsorber is a group-IV semiconductor material forming a solar cell emitter shown as n-type in the figure, and with a group-IV base, BSF, or back-heterostructure layer shown as p-type in the figure, with a group-IV tunnel junction layer shown as p-type in the figure having a different composition than the layers above and/or below it, and that forms a group-IV heterostructure between the group-IV base, BSF, or back-heterostructure layer and the group-IV tunnel junction layer.

FIG. 13 is a cross-sectional diagram of a group-IV solar cell where the primary photoabsorber is a group-IV semiconductor material forming a solar cell emitter shown as n-type in the figure, and with a group-IV first tunnel junction layer shown as p-type in the figure, with a group-IV second tunnel junction layer shown as n-type in the figure having a different composition than the layers above and/or below it, and that forms a group-IV heterostructure between the group-IV semiconductor, first, p-type tunnel junction layer (p-tunnel) and the group-IV semiconductor, second, n-type tunnel junction layer (n-tunnel).

FIG. 14 is a cross-sectional diagram of a group-IV solar cell where the primary photoabsorber is a group-IV semiconductor material forming a solar cell emitter shown as n-type in the figure, with a III-V semiconductor base, BSF, or back-heterostructure layer shown as p-type in the figure which forms a first cross-column heterostructure with the group-IV emitter, and with a group-IV semiconductor tunnel junction layer shown as p-type in the figure that forms a second cross-column heterostructure with the III-V base, BSF, or back-heterostructure layer.

FIG. 15 is a cross-sectional diagram of a group-IV solar cell where the primary photoabsorber is a group-IV semiconductor material forming a solar cell emitter shown as n-type in the figure, with a group-IV base, BSF, or back-heterostructure layer shown as p-type in the figure, with a III-V semiconductor first tunnel junction layer shown as p-type in the figure which forms a first cross-column heterostructure with the group-IV base, BSF, or back-heterostructure, and with a group-IV second tunnel junction layer shown as n-type in the figure that forms a second cross-column heterostructure with the III-V first tunnel junction layer.

FIG. 16 is a cross-sectional diagram of a group-IV solar cell where the primary photoabsorber is a group-IV semiconductor material forming a solar cell emitter shown as n-type in the figure, with a group-IV first tunnel junction layer shown as p-type in the figure, with a III-V semiconductor second tunnel junction layer shown as n-type in the figure which forms a first cross-column heterostructure with the group-IV first tunnel junction layer, and with a group-IV buffer layer shown as n-type in the figure that forms a second cross-column heterostructure with the III-V second tunnel junction layer.

A description of several charts showing experimental and calculated performance of single- and multijunction solar cells comprising a group-IV heterostructure solar cell now follows.

FIG. 17 plots experimental, measured light I-V curves of a 2-junction (2J) Ge/Ge subcell, or 2× Ge subcell, with an interconnecting AlGaAs/GaAs tunnel junction and with both subcells active, and having a structure similar to that shown in FIG. 4 with an epitaxially-grown Ge absorber layer in the upper group-IV subcell, that is largely or entirely n-type due to group-V element diffusion from III-V semiconductor layers on both top and bottom. The upper 3 subcells in FIG. 4 were replaced in this experimental sample with growth of inactive, isotype solar cell layers in order to focus on the performance of the 2J Ge/Ge cell. The inactive, isotype layers used give the full thermal budget and full light filtering properties that would come with active upper subcells. The light I-V measurements were made on modified terrestrial quick process (MTQP) solar cells, under a pulsed solar simulator at a light intensity greater than 2000 suns (200.0 W/cm2). The dual junction epitaxial Ge/substrate Ge cell pair developed a high open-circuit voltage Voc of 0.87 V at this concentration. The light I-V characteristic for a single-junction Ge subcell formed in the Ge substrate, with the same inactive, isotype upper cell layers that were used in the 2J Ge/Ge cell case, is also plotted in FIG. 13 for comparison. Under the same test conditions, this single junction Ge cell has a Voc of 0.44 V. Thus, the 2-junction Ge/Ge cell structure, with a heterojunction, epitaxially-grown Ge subcell, interconnected by a tunnel junction to another active Ge subcell formed in the Ge growth substrate, delivers approximately twice the voltage of a 1-junction Ge cell. The functioning epitaxial Ge solar cell in a dual junction Ge/Ge cell configuration, in combination with functioning tunnel junctions at high current densities, enables high-efficiency cells with 4, 5, 6, or more junctions with an epitaxial Ge subcell.

According to the present disclosure, preferred group-IV solar cells employ a heterostructure layer such as those described earlier in the text, where the solar cell is a subcell that is part of a multijunction solar cell. The group-IV solar cell structures discussed here are extremely useful when integrated into multijunction cells, such as, for example:

4J AlGaInP/AlGaInAs/Ge/Ge solar cells;
5J AlGaInP/AlGaInAs/GaInAs/Ge/Ge solar cells; and
6J AlGaInP/GaInP/AlGaInAs/GaInAs/Ge/Ge solar cells.

In all of these multijunction cells using high-bandgap AlGaInP top subcells, the emitter may have a lower Al composition (low-Al AlGaInP), or an Al-free composition (GaInP), to improve minority-carrier lifetime, mobility, diffusion length, and blue response and current density of the top subcell. Though this often results in a lower voltage of the AlGaInP-base top cell, it is often a worthwhile tradeoff because of the increased short-wavelength quantum efficiency and current produced using a low-Al or Al-free emitter.

In a conventional 3J GaInP/GaInAs/Ge solar cell there is substantial wasted photogenerated current density in the Ge bottom cell, which can be used much more effectively with the higher voltage of a 2-junction Ge/Ge cell combination at the bottom of a 4J AlGaInP/AlGaInAs/Ge/Ge solar cell. A 4-junction AlGaInP/AlGaInAs/GaInAs/Ge solar cell has the advantage of having higher voltage and lower current compared to a 3J cell, resulting in lower series resistance I$^2$R power losses, for current I and electrical resistance R, but the Ge bottom cell has an even greater wasted surplus of photogenerated current. As a result, the 4J AlGaInP/AlGaInAs/GaInAs/Ge cell benefits even more from the incorporation of a 2-junction Ge/Ge, or 2× Ge, cell combination as the bottom two subcells in a 5J AlGaInP/AlGaInAs/GaInAs/Ge/Ge solar cell. FIG. 14 shows the cross sectional diagram, calculated subcell and multijunction cell light I-V curves, and calculated light I-V parameters for this type of 5J cell. The light I-V parameters are calculations indicative of expected average production performance of the 5J cell, with an projected average efficiency over 42% under the AM1.5D spectrum at 500 suns (50 W/cm2), significantly higher than the 40% efficiency of the best conventional 3-junction cells presently available in production. There is still some excess photogenerated current in high-performance 2J Ge/Ge subcells in the 5J cell, which can be put to better use as discussed below.

FIG. 18 is a cross sectional diagram showing calculated subcell and multijunction cell light I-V curves, and calculated light I-V parameters for a 5-junction (5J) AlGaInP/AlGaInAs/GaInAs/Ge/Ge solar cell, using an epitaxial Ge cell 4, and a 2-junction Ge/Ge combination for the bottom two cells in the stack. The excess photogenerated current density can be seen in the light I-V curves of Ge subcells 4 and 5 for the 5J cell in FIG. 18. If the bandgap of subcell 3 can be lowered to convert some of this photogenerated current at the higher voltage of the GaInAs subcell, and the bandgaps of subcells 1 and 2 can be tuned to maintain current balance with this change in subcell, then less current is wasted in subcells 4 and 5 and the 5J cell efficiency increases. One way to achieve a lowering of the effective bandgap of subcell 3 is to incorporate energy wells, or low-bandgap absorber regions (LBARs), into the intrinsic region of the cell base. Such energy wells may be thin enough that the energy levels of carriers confined in the wells are shifted due to quantum mechanical effects, or may be thick enough that such quantum mechanical energy shifts are negligible. Such energy wells are typically, but not always, strain-balanced with tensile strain-compensation layers to counteract the compressive stress of, for instance, 12%-In GaInAs energy wells in a 1%-In GaInAs cell 3 intrinsic region. The energy wells in cell 3 may be used in combination with a Bragg reflector at the back of cell 3, to reflect back light that was not absorbed the energy wells on the first pass, for a second chance or more at being absorbed. The Bragg reflector can also reflect back the light generated by radiative recombination in the energy wells, which can be quite strong in a high-efficiency cell, giving that light multiple chances to be absorbed again by the energy wells, increasing the subcell 3 current density, steady-state excess carrier concentration, and subcell voltage.

By lowering the effective bandgap of subcell 3, more current is collected at the subcell 3 voltage, rather than the relatively low voltage of the Ge cells, increasing the efficiency of the 5-junction cell. FIG. 19 is a cross-sectional diagram showing calculated subcell and multijunction cell light I-V curves, and calculated light I-V parameters for a 5J cell with an epitaxial Ge cell 4 in a 2J Ge/Ge cell configuration at the bottom of the stack, and with energy wells, to lower the effective bandgap of subcell 3, resulting in higher 5J cell efficiency. The light I-V parameters are calculations indicative of expected average production performance of this type of 5J cell, with an increased projected average efficiency over 43% under the AM1.5D spectrum at 500 suns (50 W/cm2), relative to the upright, lattice-matched 5J cell with no energy wells in cell 3, as depicted in FIG. 18.

Similarly, the entire composition of GaInAs subcell 3 can be shifted to lower bandgap in a metamorphic (MM) solar cell, to make better use of the excess photogenerated current in the 2J Ge/Ge bottom cell configuration of a lattice-matched 5J cell. The lattice constant of subcell 3 is shifted to a large atomic spacing, by virtue of a metamorphic buffer that transitions from the Ge substrate lattice constant to that of the upper subcells. The bandgaps of subcells 1 and 2 are also shifted to lower values at this larger lattice constant, but this may be compensated for in the top cell by adding more Al.

As before, by lowering the effective bandgap of subcell 3 with this metamorphic approach, more current is collected at the subcell 3 voltage, rather than the relatively low voltage of the Ge cells, increasing the efficiency of the 5-junction cell. FIG. 20 is a cross-sectional diagram showing calculated subcell and multijunction cell light I-V curves, and calculated light I-V parameters for a 5J cell with an epitaxial Ge cell 4 in a 2J Ge/Ge cell configuration at the bottom of the stack, and with metamorphic subcells 1, 2, and 3 (grown with a relatively modest amount of lattice mismatch with respect to the growth substrate) to lower the bandgap of subcell 3, resulting in higher 5J cell efficiency. A relatively small amount of lattice mismatch is desirable, to keep growth costs low for the metamorphic buffer, to reduce wafer bow from strain induced by the lattice mismatch, and thereby reduce yield losses that can stem from wafer bow, and perhaps most importantly, to minimize dislocations resulting from the lattice mismatch, which can cause higher minority-carrier recombination and shunt paths for solar cells. The light I-V parameters are calculations indicative of expected average production performance of this type of 5J cell, with an increased projected average efficiency over 43% under the AM1.5D spectrum at 500 suns (50 W/cm2), relative to the upright, lattice-matched 5J cell in FIG. 18.

FIG. 21 shows the plotted results for yet another preferred arrangement contemplated by the present disclosure with the calculated external quantum efficiency (EQE), internal quantum efficiency (IQE), and overall absorptance for a 5-junction cell incorporating an epitaxial, heterojunction Ge cell 4 showing the light response of each subcell. The 5-junction cell has an AlGaInP/AlGaInAs/GaInAs/epitaxial Ge/substrate Ge cell structure, with a base bandgap combination of 2.05/1.68/1.41/0.67/0.67 eV. The top cell (cell 1 or C1) has an AlGaInP emitter bandgap of 1.95 eV in combination with the 2.05 eV base. The transparency of the thin epitaxial Ge cell 4 (C4), and its transmission of some light through to the thick substrate Ge cell 5 (C5) can be seen in the overlapping quantum efficiency curves in FIG. 21.

FIG. 22 shows yet another preferred arrangement contemplated by the present disclosure with the measured light I-V characteristics of two fully-integrated prototype 5-junction (5J) cells, incorporating a heterojunction epitaxial Ge cell 4. The 5J cells have an AlGaInP/AlGaInAs/GaInAs/epitaxial Ge/substrate Ge cell structure, with all subcells active, with a 2.05/1.64/1.40/0.67/0.67 eV base bandgap combination, as shown in the schematic diagram in FIG. 22. Both of the 5-junction cells in FIG. 18 interconnect the epitaxial heterojunction Ge cell 4 with a substrate Ge cell 5 using a III-V tunnel junction: a GaAs/GaAs tunnel junction as in FIG. 1 for the curve indicated by triangles in FIG. 22, and an AlGaAs/GaAs tunnel junction as in FIG. 4, for the curve indicated by squares in FIG. 22. The light I-V measurements were made on modified terrestrial quick process (MTQP) solar cells, under an Ioffe solar simulator at a nominal concentration at greater than 2000 suns (200.0 W/cm2). The 5-junction cells exhibit open-circuit voltage Voc of approximately 5.2 V under these test conditions. FIG. 22 also shows the light I-V characteristic of a 4-junction cell for comparison, which has the same structure as the 5J cells except that the epitaxial Ge cell 4 and associated tunnel junction are absent. These control 4J cells have the same short-circuit current density Jsc as the 5J cells, but their $V_{oc}$ is lower at approximately 4.8 V. Thus the heterojunction epitaxial Ge cell 4 contributes ~0.4 V to the 5J cell structure, as expected, enabling high-efficiency 5-junction solar cells.

Therefore, according to the present disclosure, a preferred solar cell comprises additional heterostructure layer(s) having higher bandgap(s) than the first photoabsorbing layer, in order: 1) to reduce unwanted photoabsorption in the additional heterostructure layers(s); 2) to suppress minority-carrier recombination within and at one or more surfaces of the additional heterostructure layer; and/or 3) to reduce unwanted dopant or other impurity diffusion from one part of the solar cell to another, particularly since many of these heterostructures may include both group-IV and III-V semiconductors in adjacent layers, and the elements in these different families of semiconductors act as dopants in the other family of semiconductors, a phenomenon termed here as cross-column doping, referring to the columns in the periodic table of elements.

In an alternative, the present disclosure contemplates a solar cell with at least one, first layer composed of a group-IV semiconductor, such as Ge, Si, SiGe, SiGeSn, or CSiGeSn, in which part of the solar cell such as the emitter, base, window, back surface field (BSF) layer, intrinsic layer, or tunnel junction layer comprises a second layer composed of a III-V semiconductor or group-IV semiconductor layer with different composition than the first group-IV layer, such that a heterostructure is formed between the first group-IV layer and the second III-V or group-IV layer. The group-IV layers in the solar cell may be epitaxially-grown, may be a formed from a growth substrate wafer, or may be wafer-bonded layers. The solar cell containing at least one group-IV layer may be a single-junction cell or a subcell in a multijunction solar cell, and the additional III-V semiconductor or group-IV semiconductor layers forming the heterostructure may form additional parts of the first solar cell, or may form additional subcells in a multijunction solar cell. The invention increases the voltage, current, fill factor, and/or efficiency of the multijunction or single-junction solar cell.

The heterostructure may allow the formation of the solar cell, as when the heterostructure is also a p-n junction formed between the base and emitter of the cell, allowing a multijunction or single junction solar cell to be formed with greater voltage, current, fill factor, and/or efficiency. The heterostructure may also be an isotype heterostructure, such as between the emitter and window, between the window and n-type side of a tunnel junction, between the base and BSF, or between the BSF and p-type side of a tunnel junction, allowing a multijunction or single-junction solar cell to be formed with greater voltage, current, fill factor, and/or efficiency. The heterostructure may also comprise a tunnel junction, such as when the heterostructure is a p-n junction that forms a tunnel junction, allowing a multijunction or single junction solar cell to be formed with greater voltage, current, fill factor, and/or efficiency.

The invention may be used in a lattice-matched, upright-grown multijunction solar cell, with significant advantages in growth cost, yield, wafer bowing, and processing cost compared to highly-lattice mismatched metamorphic cells or cells with an inverted-growth structure. However, the present invention may be used to advantage in multijunction cells with layers having a relatively small amount of lattice mismatch, in either metamorphic layers or pseudomorphically-strained layers such as low-bandgap absorber layers, or in pseudomorphically-strained window, emitter, base, BSF, intrinsic layers or tunnel junction layers. Also, the present invention may also be used to advantage in inverted-growth structures that are lattice-matched or have a relatively small amount of lattice mismatch.

According to the present disclosure, preferred variations include a group-IV solar cell that is optically thin in order to leak a substantial amount of light to an additional subcell beneath, e.g., an epitaxially-grown Ge, SiGe, or SiGeSn subcell on top of a Ge substrate subcell in a multijunction solar cell, in which most or all of the photoabsorbing group-IV layer in the group-IV solar cell is doped n-type by the growth of III-V subcells on top, and/or by III-V semiconductor layers on which the group-IV solar cell is grown, such that the p-n junction is formed at the back of the main photoabsorbing group-IV layer.

Further alternatives include a group-IV solar cell in which the main photoabsorbing layer is an epitaxially-grown Ge, SiGe, or SiGeSn n-type emitter layer, doped n-type by the nucleation and growth of III-V semiconductors on top of it, from which photogenerated minority holes are collected at a p-n junction at the back of this n-type Ge, SiGe, or SiGeSn emitter layer.

According to further variations, the present disclosure contemplates an n-type Ge, SiGe, SiGeSn emitter solar cell, such as those described herein, with thicknesses in the range of from about 0.01 to about 10 microns, and preferably in the range of from about 0.1 to about 2 microns, and still more preferably in the range of from about 0.3 to about 1 micron.

As shown in FIG. 1, examples of the n-type Ge, SiGe, SiGeSn emitter solar cell described above are further contemplated by the disclosure, where 1) the p-n junction at the back of the emitter layer is formed by a p-type III-V layer, which stops the n-type doping that diffuses in from the front of the cell, since the group-V elements that cause n-type doping in group-IV semiconductors are not dopants in III-V semiconductors; 2) where the p-n junction at the back of the emitter layer is a heterojunction between the n-type group-IV emitter and a p-type III-V semiconductor base or BSF layer; and 3) where the p-n junction at the back of the emitter layer is a heterojunction between the n-type group-IV emitter and a p-type GaAs base or BSF layer.

Further contemplated variations of the present disclosure include an upper group-IV solar cell that is optically thin, that transmits roughly half of the light energy incident upon it to a second, lower group-IV solar cell positioned beneath the first, upper group-IV cell, such that it is in optical series with the first cell. The upper group-IV cell and the lower group-IV cell may be connected in electrical series by a tunnel junction, which it is desirable to make as transparent as possible to the wavelengths used by the second, lower cell. Calculated quantum efficiencies of a thin, upper, epitaxial Ge subcell 4 in a 5J cell, and of an optically thick, lower Ge substrate subcell 5 in a 5J cell, are plotted as a function of wavelength for various upper subcell thicknesses in FIG. 2, using Ge absorption coefficients. The resulting current balance for various upper subcell thicknesses can be seen in FIG. 2. The current densities of both the upper and lower group-IV subcells, and the ratio of their currents, called the J-ratio, is plotted as a function of thickness in FIG. 3.

Presently contemplated solar cell further include those where the additional heterostructure layer(s) have higher bandgap(s) than the first photoabsorbing layer, in order:

1) to reduce unwanted photoabsorption in the additional heterostructure layers(s);

2) to suppress minority-carrier recombination within and at one or more surfaces of the additional heterostructure layer; and/or 3) to reduce unwanted dopant or other impurity diffusion from one part of the solar cell to another, particularly since many of these heterostructures may include both group-IV and III-V semiconductors in adjacent layers, and the elements in these different families of semiconductors act as dopants in the other family of semiconductors, a phenomenon termed here as cross-column doping, referring to the columns in the periodic table of elements.

Any of the group-IV subcell combinations discussed earlier, such as a SiGeSn cell 4/Ge cell 5 combination, may be used in place of the 2-junction Ge/Ge bottom cells in 4-junction and 5-junction cells. In addition, any of the group-IV subcell heterostructures may be used in the bottom group-IV cells of 3-junction, 4-junction and 5-junction cells. Similar arguments apply to cells with 6-junctions or more.

The group-IV solar cell layers and solar structures contemplated here in which the group-IV semiconductors are employed are designed to make use certain natural electronic band structure features and semiconductor parameters of group-IV materials. The optically-thin upper Ge, SiGe, or SiGeSn subcells can have a small physical thickness due to the high absorption coefficient of these materials relative to many indirect gap semiconductors, because of a direct gap transition that exists close to and above the indirect gap in energy for many compositions of these group-IV semiconductors. For example, Ge absorbs strongly for photon energies above the ~0.8-eV direct gap in this material, allowing relatively small thicknesses on the order of 0.5 microns to be sufficient for a Ge upper subcell for current matching, with the attendant low growth times and low cost of epitaxial growth, even though Ge is an indirect semiconductor with an indirect gap slightly lower at 0.67 eV. When charge carriers thermalize to the lower indirect gap, the requirement for an electron-hole recombination event to involve 3 bodies in order to take place—the electron, the hole, and also a phonon—resulting in a very long minority carrier lifetime compared to direct gap semiconductors. Coupled with the very high carrier mobilities in Ge, these long lifetimes result in very long minority-carrier diffusion lengths, making these group-IV solar cells highly tolerant to defects, impurities, and other imperfections that tend to increase undesirable Shockley-Read-Hall (SRH) recombination. Thus a thin solar cell with low-cost growth, combining high absorption coefficient, and high tolerance to defects and non-ideal recombination mechanisms can be achieved with Ge, SiGe, SiGeSn, and other group-IV solar cells, and it is contemplated that the best solar cells will adjust the compositions of the group-IV solar cells to maximize these effects for a given solar cell application.

In addition, it is contemplated that the band structure of group-IV layers in the solar cell may be designed, controlled, and manipulated by compressive or tensile strain in the layers, and by selection of group-IV composition, to achieve desirable optical and electrical properties in the solar cell. For example, compressive or tensile strain for certain group-IV semiconductor compositions may increase their bandgap, making them more transmissive to incident light which is desirable for layers such as tunnel junction layers, window layers, and BSF layers in which minority-carrier collection probability may be impaired, and can be desirable in emitter and base layers to adjust subcell bandgap and current collection, and increase subcell voltage. Compressive and tensile strain, and group-IV composition may also be used to adjust whether the semiconductor has an indirect gap or a direct gap as the lowest energy transition, may be used to adjust the energy difference between indirect and direct bandgaps, and may be used to adjust effective densities of states in the conduction and valance bands, affecting photoabsorption in the layers, as well as the ease at which the semiconductors may be doped degenerately with the Fermi level residing in the conduction or valance band of allowed energies, impacting the ease and doping level at which tunnel junctions may be constructed in the group-IV semiconductor material.

Structures with selective wavelength reflection and anti-reflection (AR) structures may be combined with group-IV solar cells, and their reflectance properties may be tuned to increase the performance of the group-IV solar cell, and/or a multijunction solar cell in which it is used, for example: Bragg reflector structures using semiconductor materials with different refractive indices, may be incorporated behind a group-IV solar cell to increase the optical path length and current density of that cell, such as in an epitaxial cell 4 or substrate cell 5 in an upright 5-junction solar cell, epitaxial cell 4 and/or epitaxial cell 5 in an inverted 5-junction solar cell, epitaxial cell 4 and/or epitaxial cell 5 and/or substrate cell 6 in an upright 6-junction solar cell, etc.; back surface reflector structures using a metal/dielectric, metal/semiconductor, and/or semiconductor/dielectric structure, in addition to all-semiconductor structures may be incorporated with a group-IV cell to increase its current density, such as the substrate cell 5 of an upright 5-junction cell, the epitaxial cell 5 of an inverted 5-junction solar cell, or the bottom cell of an upright or inverted multijunction solar cell with 2, 3, 4, 5, 6 or more junctions. Multilayer AR coatings on the front or the back of the solar cell may be tuned with regard to their reflective properties as a function of wavelength, in order to increase the performance of a multijunction cell incorporating a group-IV solar cell.

Although most examples here have discussed an n-on-p solar cell configuration, in which light first strikes the n-type side of the solar cell p-n junction, similar principles can be adapted to apply to, and the present disclosure contemplates, p-on-n solar cell configurations as well.

In addition, although most examples here have discussed structures that make use of or can function with cross-column doping between group-IV semiconductors and III-V semiconductors, similar principles can also be adapted to, and the present disclosure contemplates, devices incorporating group-IV, III-V, II-VI, I-III-VI, III-IV-VI, and other families of semiconductors, and the cross-column doping that can take place between them.

Further, although most examples shown here discuss group-IV solar cells with group-IV semiconductor layers formed from column-IV elements alone, other chemical compounds are contemplated, such as those that include one or more group-IV elements in combination with one or more group-III elements, e.g., boron in combination with silicon, BSi; AlSi; or GaGe, or that include one or more group-IV elements in combination with one or more group-V elements, e.g., phosphorus in combination with silicon, SiP; SiN; or GeAs. Such compounds may be useful for highly doped layers such as tunnel junction layers, or may be used for other layers of the solar cell such as contact, window, emitter, base, and BSF regions.

Although most examples shown here may use III-V semiconductors for the contact layers (also known as cap layers), group-IV semiconductors such as Ge, Si, SiGe, SiGeSn, and CSiGeSn, may be used as the contact or cap layers. These layers have relatively low bandgaps compared to many III-V semiconductors, helping to lower contact resistance between the semiconductor contact layer and a metal contact, and group-IV materials can be grown lattice-matched to a variety of III-V compounds, maintaining high crystal defect density. Since in an upright growth configuration the front contact or cap layer is the last layer grown, even if the contact material, e.g., a group-IV contact material, has a high lattice mismatch to the III-V layers it is grown on (such as a lower layer of the contact or cap structure formed from III-V semiconductors), the structure can be highly tolerant of the high lattice mismatch, since no further semiconductor layers will be grown on top of the last contact layer, and hence the dislocation density in the last contact layer can be quite high without harming active layers in the device for which long minority-carrier lifetime is important. It is also considered in this disclosure that group-IV layers grown as the last layer or layers on the top of the multijunction solar cell may be used to construct bypass diodes for the purpose of protecting the multijunction solar cell or other multijunction cells in the circuit, or blocking diodes or other types or electronic and optoelectronic devices that are grown monolithically with the multijunction cell itself, for use in the solar cell circuit.

Still further, although most examples here have discussed upright, lattice-matched multijunction cells, the subcells in the multijunction cell, including the group-IV subcells described in this disclosure, may be grown inverted, such as, for example, with the sunward surface of the cell grown first, and in a multijunction cell with the higher bandgap subcells grown first, and/or may be grown as metamorphic cells, lattice-mismatched with respect to the growth substrate or to the surface on which they are grown. A potential advantage of inverted growth may be that the lower group-IV cells and associated tunnel junctions will experience less degradation from the thermal budget of the other subcells in an inverted configuration, since the lower group-IV cells will be grown after the upper subcells in an inverted configuration. A potential advantage of metamorphic or lattice-mismatched growth is the larger range of semiconductor materials, compositions, and bandgaps this approach allows. For example, metamorphic SiGe subcells may be grown on Si substrates, metamorphic SiGe subcells may be grown on Ge substrates, metamorphic CSiGeSn subcells may be grown on Si or Ge substrates, lattice-mismatched or metamorphic Ge subcells may be grown as the bottommost cell (cell 4) in a 4-junction inverted metamorphic cell design, replacing the ~0.7-eV metamorphic GaInAs cell usually used in that position, thus reducing the growth time required for the second metamorphic buffer normally required in usual 4-junction inverted metamorphic cell design, etc.

While most examples here have discussed a monolithic, epitaxially-grown multijunction cell structure that may be formed in 1, 2, 3, or more epitaxial growth runs on the same growth substrate, the present disclosure contemplates that the subcells in the multijunction cell, such as, for example, the epitaxial group-IV and/or substrate group-IV cell or cells, also may be integrated into the multijunction structure using wafer bonding, or semiconductor bonding technology (SBT), or using a combination of monolithic growth and SBT. Examples include the upper 3-junction AlGaInP/AlGaInAs/GaInAs cell combination semiconductor bonded or bonded with a metal/dielectric interface to lower group-IV cells, such as, for example, a 1-junction Ge, SiGe, or SiGeSn cell, a 2-junction Ge/Ge, SiGe/Ge, or SiGeSn/Ge cell, or 3-junction SiGeSn/SiGeSn/Ge group-IV cell, to form 4, 5, or 6-junction SBT cells that incorporate one or more group-IV subcells.

Still further, while most examples herein have discussed group-IV solar cells with heterostructures formed between solar cell layers such as between emitter and base, or between base and BSF, etc., the present disclosure contemplates that heterostructures may also be formed within these solar cell layers, with lower bandgap, higher bandgap, or the same bandgap as the surrounding material in the solar cell layer. For example, energy wells may be placed in the main absorber layer of a group-IV solar cell that may be an emitter, base, or other layer of a solar cell, to lower the effective bandgap of the group-IV absorber layer, such as, for example, strained or unstrained Ge, SiGe, or SiGeSn energy wells and/or strain-balance layers in a group-IV absorber layer grown on a silicon substrate, such as, for example, metamorphic SiGe or pseudomorphic SiGeSn absorber layers, GeSn or SiGeSn energy wells in a Ge absorber to lower the effective bandgap of cell 5 in a 5-junction cell below that of Ge, GeSn energy wells in combination with SiGe strain-balance layers, and/or unstrained Ge energy wells in SiGeSn solar cell absorber layers.

While most examples here have discussed forming the group-IV solar cell layers using epitaxial growth, such as, for example: chemical vapor deposition (CVD), ultra-high-vacuum chemical vapor deposition (UHVCVD), metal-organic vapor-phase epitaxy (MOVPE), molecular beam epitaxy (MBE), liquid phase epitaxy (LPE), and others; or by dopant diffusion into a group-IV substrate, the present disclosure also contemplates that the group-IV solar cell layers may also be formed by other methods. These include, for example, physical vapor deposition (PVD) with or without subsequent annealing and/or recrystallization, and ion implantation of dopants and/or main components of the group-IV semiconductor into a starting group-IV substrate, such as, for example: implantation of Si into a Ge substrate to form a SiGe solar cell layer; Si and Sn into a Ge substrate to form a SiGeSn cell layer; carbon (C) into a Ge substrate to form a CGe layer; Ge into a silicon (Si) substrate to form a SiGe solar cell layer; Ge and Sn into a Si substrate to form a SiGeSn cell layer; n-type dopants into a p-type group-IV substrate, or other epitaxially-grown, diffused, or ion-implanted layer, to form an n-type layer, and/or p-type dopants into an n-type group-IV substrate, or other epitaxially-grown, diffused, or ion-implanted layer, to form a p-type layer.

In addition, although most examples here have discussed the formation of group-IV solar cells with the goal of incorporating them into a multijunction solar cell in combination with another group-IV solar cell to form a 2-junction group-IV solar cell pair within a larger multijunction stack which includes additional III-V subcells, the present disclosure also contemplates applying the principles disclosed herein to: single-junction group-IV solar cells; to group-IV solar cell combinations incorporating 3 or more group-IV solar cells in a multijunction solar cell stack; and/or to multijunction cells that include subcells formed from group-IV, III-V, II-VI, III-IV-VI, and additional families of semiconductors.

Although most examples here have discussed solar cells, the disclosure further contemplates usefulness with other types of optoelectronic devices employing photovoltaic cells and systems. Indeed, any required need for sustainable energy storage and deployment would find use and benefit from the present disclosure. For example, due to the increased efficiency of the photovoltaic cell systems of the present disclosure, manned or unmanned vehicular operation in a terrestrial and/or non-terrestrial setting are made possible. Contemplated vehicles include manned and unmanned aircraft, spacecraft, terrestrial, non-terrestrial and surface and sub-surface water-borne vehicles.

While the preferred variations and alternatives of the present disclosure have been illustrated and described, it will be appreciated that various changes and substitutions can be made therein without departing from the spirit and scope of the disclosure. Accordingly, the scope of the disclosure should only be limited by the accompanying claims and equivalents thereof.

We claim:

1. A monolithic photovoltaic cell comprising:
   a first group-IV subcell;
   a second group-IV subcell comprising:
      a first layer comprising an emitter layer, the emitter layer comprising a group-IV semiconductor material selected from the group consisting of: Ge, SiGe, CGe, GeSn, SiGeSn, CSiGeSn, and combinations thereof, the emitter layer being the primary photoabsorber layer of the second group-IV subcell; and
      a second layer comprising a group III-V semiconductor material between the first group-IV subcell and the first layer, the second layer being adjacent to, and forming a heterostructure with, the first layer, the second layer comprising a base layer, the emitter layer being thicker than the base layer;
   a subcell 1 comprising AlGaInP; and
   a subcell 2 comprising a III-V semiconductor material chosen from AlGaAs and AlGaInAs;
   wherein the second group-IV subcell is between the first group-IV subcell and the subcell 2, the first group-IV subcell and the second group-IV subcell being the two lowest subcells of the monolithic photovoltaic cell; and
   wherein the combination of the first group IV subcell and the second group IV subcell enables the monolithic photovoltaic cell to achieve a higher-efficiency when compared to another photovoltaic cell having the same configuration of subcells as the monolithic photovoltaic cell but without the second group IV subcell.

2. The photovoltaic cell of claim 1, wherein the second layer further comprises a component of a solar cell selected from the group consisting of: a window, a front-heterojunction layer, a back-surface-field layer, a back-heterojunction layer, an intrinsic layer, a tunnel junction layer, and a contact layer.

3. The photovoltaic cell of claim 1, wherein the first layer is formed by epitaxial growth.

4. The photovoltaic cell of claim 1, further comprising a subcell 3, the subcell 2 comprising AlGaInAs and the subcell 3 comprising GaInAs.

5. The photovoltaic cell of claim 1, wherein electronic doping of the first layer comprises dopant atoms comprising column-III elements, column-V elements, or a combination of column-III elements and column-V elements that are present in the second layer.

6. The photovoltaic cell of claim 1, wherein electronic doping of the second layer comprises dopant atoms comprising a group-IV semiconductor element that is present in the first layer.

7. The photovoltaic cell of claim 1, wherein the emitter layer is designed to be closer to a primary light source than the base layer during photovoltaic cell operation.

8. The photovoltaic cell of claim 1, wherein the emitter layer is presented to the cell via a method selected from the group consisting of: deposition, growth and diffusion, after the formation of the base layer of the photovoltaic cell.

9. The photovoltaic cell of claim 1, wherein the emitter layer bandgap energy is lower than the base layer bandgap energy.

10. The photovoltaic cell of claim 1, further comprising energy wells positioned at a location selected from the group consisting of: a main photogeneration layer, an emitter layer, and a base layer of the cell, and wherein the energy wells comprise at least one group-IV semiconductor region, with at least one energy well having a lower energy bandgap than adjacent regions.

11. The photovoltaic cell of claim 3, further comprising a feature selected from the group consisting of: energy wells, and low-bandgap absorber regions (LBARs) in other subcells of the photovoltaic cell, wherein the group-IV semiconductor layer is positioned, to modify the effective bandgap, light transmission, and photogenerated and collected current density in the other subcells.

12. The photovoltaic cell of claim 1, comprising a reflector on the front or the back of the photovoltaic cell, selected from the group consisting of:
a semiconductor Bragg reflector,
a dielectric stack reflector,
a metal reflector,
a combined dielectric/semiconductor reflector,
a combined dielectric/metal reflector, and
a combined semiconductor/metal reflector.

13. The photovoltaic cell of claim 1, comprising a passivation layer on the front or the back of the photovoltaic cell, reducing surface minority-carrier recombination in the cell, selected from the group consisting of:
a deposited amorphous silicon layer;
a deposited amorphous germanium layer;
a deposited amorphous layer comprising carbon, silicon, and/or germanium;
a dielectric layer comprising silicon dioxide, silicon oxide, or silicon nitride;
a deposited semiconductor layer comprising zinc oxide or indium tin oxide;
a chemical surface treatment comprising hydrogen, fluorine, sulfur, or selenium deposited on the surface; and
combinations of the above.

14. The photovoltaic cell of claim 1, wherein the heterostructure comprises a heterointerface or heterojunction, and wherein said heterostructure comprises materials selected to reduce minority-carrier recombination at layer interfaces, and within the bulk of the materials on each side of the heterointerface or heterojunction.

15. The photovoltaic cell of claim 1, further comprising a tunnel junction between the first group-IV subcell and the second group-IV subcell.

16. The photovoltaic cell of claim 15, wherein the second group-IV subcell is an epitaxially-grown subcell.

17. The photovoltaic cell of claim 15, wherein the first group-IV subcell is formed on or in a semiconductor wafer substrate, said semiconductor wafer substrate made from a material selected from the group consisting of: Ge and Si.

18. The photovoltaic cell of claim 1, wherein:
the emitter layer has a first doping type, and
the second layer has a second doping type and the second doping type is the opposite doping type with respect to the first doping type in the emitter layer.

19. The photovoltaic cell of claim 18, wherein the second layer forms a cross-column heterostructure with a third layer comprising a group-IV tunnel junction layer, said third layer having a third doping type, said third doping type having the same doping type with respect to the second layer doping type.

20. The photovoltaic cell of claim 1, further comprising contact or cap layers, and wherein:
the contact or cap layers comprise group-IV semiconductors selected from the group consisting of: Ge, Si, SiGe, SiGeSn, and CSiGeSn.

21. The photovoltaic cell of claim 1, wherein:
the photovoltaic cell further comprises bypass diodes or blocking diodes formed from group-IV semiconductors selected from the group consisting of: Ge, Si, SiGe, SiGeSn, and CSiGeSn.

22. An energy generation system comprising the photovoltaic cell of claim 1.

23. An energy storage system comprising the photovoltaic cell of claim 1.

24. A vehicle comprising the photovoltaic cell of claim 1.

25. A monolithic photovoltaic cell comprising:
a first group-IV subcell;
a second group-IV subcell comprising:
a first layer comprising an emitter layer, the emitter layer comprising a first semiconductor material from a first family of semiconductor materials, the emitter layer being the primary photoabsorber layer of the second group-IV subcell; and
a second layer comprising a second semiconductor material from a second family of semiconductor materials different from the first family of semiconductor materials, the second layer comprising a base layer, the emitter layer being thicker than the base layer;
a subcell 1 comprising AlGaInP; and
a subcell 2 comprising a III-V semiconductor material chosen from AlGaAs and AlGaInAs,
wherein the second group-IV subcell is between the first group-IV subcell and the subcell 2, the first group-IV subcell and the second group-IV subcell being the two lowest subcells of the monolithic photovoltaic cell;
wherein the first family of semiconductor materials are group-IV semiconductors selected from the group consisting of: Ge, SiGe, CGe, GeSn, SiGeSn, CSiGeSn, and combinations thereof and the second family of semiconductor materials are selected from the group consisting of: group-IV semiconductors and III-V semiconductors; and
wherein a heterostructure is formed between the first layer and the second layer, the heterostructure comprising a cross-column heterostructure.

26. A monolithic photovoltaic cell comprising:
a first group-IV subcell;
a second group-IV subcell comprising:
a first layer comprising an emitter layer, the emitter layer comprising a group-IV semiconductor material selected from the group consisting of: Ge, SiGe, CGe, GeSn, SiGeSn, CSiGeSn, and combinations thereof, the emitter layer being the primary photoabsorber layer of the second group-IV subcell; and
a second layer being a base layer or a back-surface field layer, the second layer comprising a group III-V semiconductor material between the first group-IV subcell and the first layer, the group III-V semiconductor material of the second layer being adjacent to, and forming a heterostructure with the emitter layer;
a subcell 1 comprising AlGaInP; and
a subcell 2 comprising a III-V semiconductor material chosen from AlGaAs and AlGaInAs,
wherein the second group-IV subcell is between the first group-IV subcell and the subcell 2, the first group-IV subcell and the second group-IV subcell being the two lowest subcells of the monolithic photovoltaic cell, wherein the emitter layer is thicker than the second layer.

27. The photovoltaic cell of claim 26, wherein the second layer is the base layer, the photovoltaic cell further comprising a tunnel junction electrically connecting the first group-IV subcell and the second group-IV subcell, the tunnel junction comprising a group III-V semiconductor material.

\* \* \* \* \*